US012590770B2

(12) United States Patent
Harrington et al.

(10) Patent No.: US 12,590,770 B2
(45) Date of Patent: Mar. 31, 2026

(54) LIQUID COOLING SYSTEM AUTOMATED ADDITIVE CONTROL

(71) Applicant: Chilldyne, Inc., Carlsbad, CA (US)

(72) Inventors: Steven Merrill Harrington, Cardiff, CA (US); Douglas David Gaylord, San Diego, CA (US); Trevor Russell Irwin, Sacramento, CA (US); Michael Timothy Coffin, Grass Valley, CA (US); Anne Margaret Elliott, San Diego, CA (US)

(73) Assignee: Chilldyne, Inc., Carlsbad, CA (US)

( * ) Notice: Subject to any disclaimer, the term of this patent is extended or adjusted under 35 U.S.C. 154(b) by 0 days.

(21) Appl. No.: 18/932,322

(22) Filed: Oct. 30, 2024

(65) Prior Publication Data

US 2025/0130000 A1     Apr. 24, 2025

Related U.S. Application Data

(63) Continuation of application No. PCT/US2024/052139, filed on Oct. 18, 2024.
(Continued)

(51) Int. Cl.
*F28F 27/00* (2006.01)
*F28F 19/00* (2006.01)
(Continued)

(52) U.S. Cl.
CPC .............. *F28F 27/00* (2013.01); *F28F 19/00* (2013.01); *G01N 21/94* (2013.01);
(Continued)

(58) Field of Classification Search
None
See application file for complete search history.

(56) References Cited

U.S. PATENT DOCUMENTS

| | | |
|---|---|---|
| 6,510,368 B1 | 1/2003 | Beardwood |
| 2017/0120311 A1* | 5/2017 | Timmons ................ C02F 1/441 |
| 2018/0186656 A1 | 7/2018 | Drewniak et al. |

FOREIGN PATENT DOCUMENTS

| | | |
|---|---|---|
| CN | 102538572 | 10/2013 |
| JP | 2010194402 | 9/2010 |

OTHER PUBLICATIONS

Comprehensive Review of the Use of Biocides in Microbiologically Influenced Corrosion, Shi et al; Microorganisms2023, Aug. 30, 2023.

(Continued)

*Primary Examiner* — Mohammad Ali
*Assistant Examiner* — Saad M Kabir
(74) *Attorney, Agent, or Firm* — Manuel de la Cerra

(57)     ABSTRACT

An automated system to monitor and maintain the water quality in a liquid cooling system for computer servers. The ACQ system includes a side stream flow system with banks of chemical sensors, digital video recording, PLC control systems, chemical addition tanks, valves, injection manifold, chemical verification of additive methods, filters, and alert systems. Water is monitored in the flow loop with sensors to establish a baseline chemical profile. Changes in water chemistry or at periodic intervals trigger an automatic adjustment of water chemistry with various chemicals held on the system in tanks. Confirmation of the injection of chemicals is accomplished with gravimetric methods and measured chemical change to the system. Deviations from baseline chemical characteristics can trigger injections of chemicals depending on the specific variation.

14 Claims, 15 Drawing Sheets

Coolant Distribution Unit- 10

Coolant Distribution Unit- 10

Related U.S. Application Data

(60) Provisional application No. 63/544,667, filed on Oct. 18, 2023.

(51) Int. Cl.
    *G01N 21/94*           (2006.01)
    *H05K 7/20*            (2006.01)

(52) U.S. Cl.
    CPC ..... *H05K 7/20254* (2013.01); *H05K 7/20281* (2013.01); *F28F 2265/20* (2013.01)

(56)              References Cited

OTHER PUBLICATIONS

International Search Report for PCT/US2024/052139, dated Feb. 7, 2025, 18 pages.

* cited by examiner

Coolant Distribution Unit- 10

Coolant Distribution Unit- 10

LEGEND FOR FIGS. 1A and 1B

Automatic Coolant Quality (ACQ) Subsystem-100

Additive Tank 200

Additive Tank 200

Optical Monitoring Subsystem 140

Heat Transfer Sensor (Dummy Cold Plate) 142

UV Sterilizer 32

Heat Exchanger Bypass
Subsystem 37

LIQUID COOLING SYSTEM AUTOMATED ADDITIVE CONTROL

CROSS-REFERENCE TO RELATED APPLICATIONS

The present application claims priority as a continuation of application PCT/US24/52139 filed on Oct. 18, 2024 which claims priority to U.S. provisional of Ser. No. 63/544, 667 filed on Oct. 18, 2023. The full disclosure of these references is herein incorporated by reference.

This application is related to the following applications and patents, each of which is hereby incorporated by reference in its entirety: U.S. Pat. No. 8,820,351 issued on Sep. 2, 2014; U.S. Pat. No. 9,010,141 issued on Apr. 21, 2015; U.S. Pat. No. 9,161,480 issued on Oct. 13, 2015; U.S. Pat. No. 10,920,772 issued on Feb. 16, 2021; U.S. Pat. No. 10,582,641 issued on Mar. 3, 2020; U.S. Pat. No. 11,317,535 issued on Apr. 26, 2022; U.S. Pat. No. 11,337,340 issued on May 17, 2022; and U.S. Pat. No. 11,175,102 issued on Nov. 16, 2021.

STATEMENT REGARDING FEDERALLY SPONSORED RESEARCH AND DEVELOPMENT

This invention was made with Government support under Award No. DE-AR0001595, awarded by the Advanced Research Projects Agency—Energy (ARPA-E), U.S. Department of Energy. The Government has certain rights in this invention.

FIELD OF THE INVENTION

The present invention relates to systems and methods for cooling computer systems.

BACKGROUND OF THE INVENTION

Arrays of electronic computers or components, such as those found in data centers, generate a great deal of heat. An example central processing unit of a personal computer ("CPU") generates over 500 watts of heat (some can generate much more than this) and has a maximum case temperature of about 70 C. An example array (or rack) of 88 CPUs may generate 45 kW of heat. Data Center Computer liquid cooling systems, also know as coolant distribution units (CDU) include cool and warm metal surfaces with flowing water-based coolant may be used to evacuate heat from these electronic computers or components.

The coolant within the CDU can undergo chemical reactions which lead to the formation of precipitate, scale and other solids that interfere with the heat transfer, pumps and/or valves. The coolant may also corrode metals in the system or react with plastics. In addition, any system that has coolant that is periodically exposed to the environment may admit dust, dirt and biologicals (algae, bacteria, fungi) that may colonize and cause reduced system performance.

Provide herein is a CDU with an Automated Coolant Quality (ACQ) control to eliminate these problems. This system includes internal verification to ensure that chemicals are added, alerts if the coolant quality cannot be assured, and automated chemical injection based on system feedback. In this way the failure of a single component cannot lead to a situation where corrosion or contamination proceeds unabated and regular manual testing of the coolant is not needed.

SUMMARY OF THE INVENTION

An automatic coolant quality subsystem (ACQ) for use in a coolant distribution unit is disclosed. The ACQ includes a coolant conduit comprising a coolant and an oxidative reduction potential (ORP) sensor fluidly connected to the coolant conduit. The ACQ also includes an additive injection subcomponent fluidly connected to the coolant conduit, the injection subcomponent includes a plurality of injection branches, each branch has an additive container fluidly connected to a valve, an additive flow meter and the coolant conduit. At least one additive container has an oxidizing biocide and a corrosion inhibitor. A processor is connected to the ORP sensor and the additive injection subcomponent. The processor is programmed to perform the following steps: (a) measure and record the value from the ORP sensor (105) at time t0; (b) actuate the valve to release a predetermined amount of oxidizing biocide into the coolant; (c) measure and record the value from the ORP sensor at time t1 and t2; (d) compare the change in the ORP values over time to an expected change; (e) if the change in the ORP values over time is faster than the expected change, then return to step (a); (f) if the change in the ORP values over time is equal to or slower than the expected change, then actuate the valve to release a predetermined amount of corrosion inhibitor into the coolant.

The ACQ may also have at least one additive container (200) that has a non-oxidizing biocide. The processor performs the following additional steps: (g) after step (f) wait until the value from the ORP sensor is less than 25% of ORP value at time t0; and (h) actuate the valve to release a predetermined amount of non-oxidizing biocide into the coolant.

The ACQ may also have at least one additive container (200) that has an algaecide. The processor performs the following additional steps: (g) after step (f) actuate the valve to release a predetermined amount of algaecide into the coolant.

The ACQ may also have at least one additive cntainer that has a descaler. The processor performs the following additional steps: (g) after step (f) actuate the valve to release a predetermined amount of descaler into the coolant.

The ACQ may have a first total dissolved solids (TDS) sensor fluidly connected to the coolant conduit, and an additive injection subcomponent fluidly connected to the coolant conduit downstream of the upstream sensor bank. The injection subcomponent includes a plurality of injection branches, each branch comprising an additive container fluidly connected to a valve, an additive flow meter and the coolant conduit. Also, each additive container includes an additive mass sensor. The ACQ also has a second TDS sensor fluidly connected to the coolant conduit downstream of the additive injection subcomponent. A processor is connected to first TDS sensor, the second TDS sensor, the additive flow meter, the valve and the additive mass sensor. The processor is programmed to perform the following steps: (a) measure and record the values from the first TDS sensor (and the additive mass sensor; (b) actuate the valve to release a predetermined amount of additive the coolant; (c) record whether the additive flow meter registers a flow of additive; (d) measure and record the value from the second TDS sensor; (e) actuate the valve to close; (f) measure and record the value from the additive mass sensor after step (e); (g) confirm a successful additive injection if at least two of the following conditions are true: (1) the TDS sensor value from step (a) is greater than the TDS sensor value from step (d); (2) the additive mass sensor value from step (a) is greater than the additive mass sensor value from step (f); (3) the additive flow meter (120) registered a flow of additive in step (c).

The ACQ may also have a pH sensor and an oxidative reduction potential (ORP) sensor fluidly connected to the coolant conduit. The processor is connected to pH sensor and oxidative reduction potential sensor, and performs the following additional steps: (h) prior to step (b), measure and record the values from the pH sensor and the ORP sensor; (i) if additive injection is unsuccessful at step (g), then record and measure values from pH sensor, the ORP sensor and at least one of the TDS sensor; (j) confirm a successful additive injection if at least two of the following conditions are true: (1) the TDS sensor value from step (a) is measurably different than the TDS sensor value from step (i); (2) the pH sensor value from step (h) is measurably different than the pH sensor value in step (i); (3) the ORP sensor value from step (h) is measurably different than the ORP sensor value in step (i); (k) if additive injection is unsuccessful at step (j), then return to step (a).

The processor may also perform the following steps: (h) after step (e), measure and record the values from the first TDS sensor and the second TDS sensor; (i) confirm successful closure of valve if the TDS values from step (h) are equal; (j) if the TDS values from step (h) are not equal, then actuate the valve to close multiple times and return to step (h).

The processor may compute the predetermined amount of oxidizing biocide, corrosion inhibitor, non-oxidizing biocide, algaecide and descaler based on a total quantity of coolant in the CDU. The oxidizing biocide may include sodium hypochlorite or monochloramines. The corrosion inhibitor may include azoles, chlorinated azoles, or molybdate ion. The non-oxidizing biocide may include isothiazolinones, methyl isothiazolinones, chloromethyisotiazolinones, quaternary ammonium compounds, EDTA, or BNPD. The algaecide may include copper ethanolamine complexes, copper sulfate, or quaternary ammonium compounds. The descaler may include Nu-Calgon Scale Remover 4330-08, QwikDESCALER+ from Mainstream Engineering or citric acid.

A heat exchanger bypass subsystem for use in a coolant distribution unit (CDU) containing at least one cold plate in thermal contact heat-generating electronic component is also disclosed. The bypass subsystem includes a pre-exchanger coolant conduit comprising a coolant, a post-exchanger coolant conduit, a temperature sensor in contact with the coolant, a heat exchanger fluidly connected downstream of the pre-exchanger coolant conduit and upstream of the post-exchanger coolant conduit, a bypass valve fluidly connecting the pre-exchanger coolant conduit to the post-exchanger coolant conduit, an ambient relative humidity sensor, an ambient temperature sensor and a processor connected to the temperature sensor, the bypass valve, the ambient relative humidity sensor and the ambient temperature sensor. The processor may be programmed to perform the following steps: (a) measure and record the values from the temperature sensor, the relative humidity sensor and the ambient temperature sensor; (b) if, based on the values in step (a) the processor determines the coolant may cause condensation on the cold plate, then open the bypass valve; otherwise maintain bypass valve closed or close the bypass valve. These steps may be performed periodically during the operation of the CDU.

An optical monitoring subsystem for use in a coolant distribution unit is also disclosed. The optical monitoring subsystem includes a coolant conduit comprising a coolant, a transparent region, a copper coupon and a stainless-steel coupon. The copper coupon and the stainless-steel coupon are in contact with the coolant and visible through the transparent region. A light source illuminates the copper coupon and the stainless-steel coupon with electromagnetic energy comprised of visible wavelengths, infrared wavelengths and ultraviolet wavelengths. A sensor or sensors capture images of the illuminated copper coupon and stainless-steel coupon, and may report those images to a system operator or may process those images. A processor may be connected to the sensor or sensors and may perform the following steps: capture images from the sensors periodically; compare the captured images to detect color changes and/or growth of biofilms; issue an alert if color changes and/or growth of biofilms is detected. The stainless-steel coupon may further include a stainless-steel mesh.

Additional aspects, alternatives and variations as would be apparent to persons of skill in the art are also disclosed herein and are specifically contemplated as included as part of the invention. The invention is set forth only in the claims as allowed by the patent office in this or related applications, and the following summary descriptions of certain examples are not in any way to limit, define or otherwise establish the scope of legal protection.

BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. Furthermore, various features of different disclosed embodiments can be combined to form additional embodiments, which are part of this disclosure. It will be understood that certain components and details may not appear in the figures to assist in more clearly describing the invention.

DETAILED DESCRIPTION OF THE INVENTION

Figure 1A:
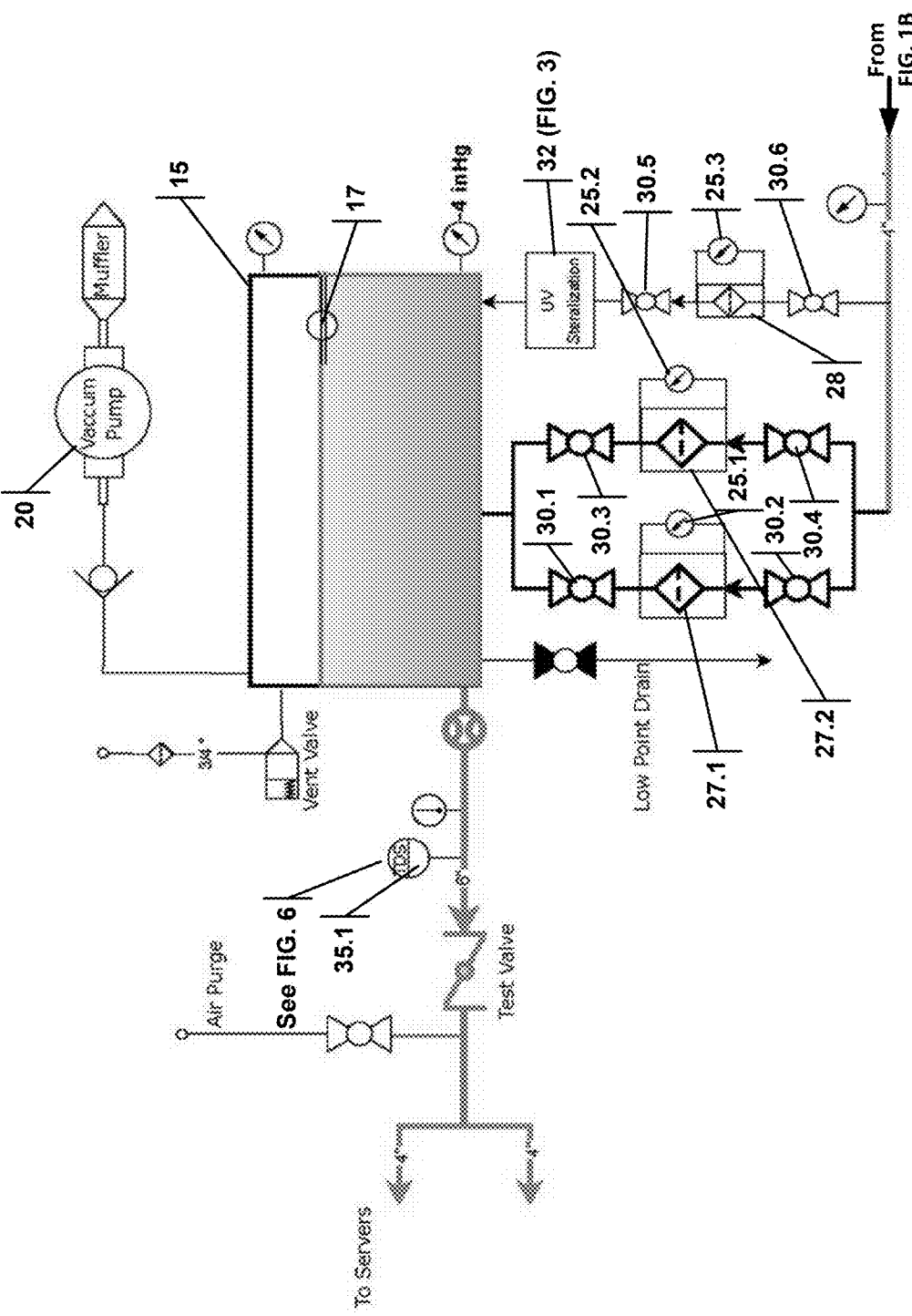
FIG. 1A is a schematic showing a first portion of a coolant distribution unit (CDU).

Reference is made herein to some specific examples of the present invention, including any best modes contemplated by the inventor for carrying out the invention. Examples of these specific embodiments are illustrated in the accompanying figures. While the invention is described in conjunction with these specific embodiments, it will be understood that it is not intended to limit the invention to the described or illustrated embodiments. To the contrary, it is intended to cover alternatives, modifications, and equivalents as may be included within the spirit and scope of the invention as defined by the appended claims.

In the following description, numerous specific details are set forth to provide a thorough understanding of the present invention. Example embodiments of the present invention may be implemented without some or all these specific details. In other instances, process operations well known to persons of skill in the art have not been described in detail in order not to obscure unnecessarily the present invention. Various techniques and mechanisms of the present invention will sometimes be described in singular form for clarity. However, it should be noted that some embodiments include multiple iterations of a technique or multiple mechanisms unless noted otherwise. Similarly, various steps of the methods shown and described herein are not necessarily performed in the order indicated, or performed at all in certain embodiments. Accordingly, some implementations of the methods discussed herein may include more or fewer steps than those shown or described. Further, the techniques and mechanisms of the present invention will sometimes describe a connection, relationship or communication between two or more entities. It should be noted that a connection or relationship between entities does not necessarily mean a direct, unimpeded connection, as a variety of other entities or processes may reside or occur between any two entities. Consequently, an indicated connection does not necessarily mean a direct, unimpeded connection unless otherwise noted.

The following list of example features corresponds with the attached figures and is provided for ease of reference, where like reference numerals designate corresponding features throughout the specification and figures:

Coolant Distribution Unit 10
Coolant Reservoir 15
Coolant Level Sensor 17
Vacuum Pump 20
Differential Pressure Transducer/Sensor 25.1-25.4
Filter (50 Microns) 27.1, 27.2
Filter (1 Micron) 28
Valves 30.1-30.8
UV Sterilizer 32
Total Dissolved Solids Sensor 35.1-35.4
Heat Exchanger Bypass Subsystem 37
Primary Heat Exchanger 40
Pre-Exchanger Coolant Conduit 40.1
Post-Exchanger Coolant Conduit 40.2
Bypass Valve 45
Fluid Lines 47
Coolant Temperature Sensor 50
Ambient Temperature Sensor 55
Relative Humidity Sensor 60
Processor 65

Low Performance Heat Exchanger 70
Coolant Pump (Lobe Type) 75
Coolant Refill and Drainage Subsystem 80
Automatic Coolant Quality Subsystem 100
Upstream Sensor Bank 101
Downstream Sensor Bank 102
Additive Injection Subcomponent 103
Coolant Conduit 104
Oxidation Reduction Potential Sensor 105
pH Sensor 110
Total Suspended Solids Sensor 115
Additive Flow Meters 120
Additive Valves 125
Orifice/Flow Controller 130
Pressure Transducer/Sensor 135
Optical Monitoring Subsystem 140
Bypass 141
Heat Transfer Sensor 142
Cold Plate 142.1
Heater 142.2
Temperature Sensor 142.3
Temperature Sensor 142.4
Photo Diode 145
Coolant Flow Direction 150
Coolant Conduit 155
Transparent Region 160
Copper Coupon 165A
Copper Coupon Visible Light Sensor/Camera 165B
Copper Coupon IR Sensor/Camera 165C
Stainless Steel Coupon 166A
Stainless Steel Coupon Visible Light Sensor/Camera 166B
Stainless Steel Coupon IR Sensor/Camera 166C
Stainless Steel Mesh Coupon 167A
Stainless Steel Mesh Coupon Visible Light Sensor/Camera 167B
Stainless Steel Mesh Coupon IR Sensor/Camera 167C
IR Light Source 170
Visible Light Source 175
UV Light Source 180
UV Light Source 185
UV Sensor/Camera 190
Additive Tank 200
Optional Descaler Injection 201
Dip Tube 205
Load Cell 210
Camera 210.1
Level Switch 215
Vent 220
Filter 225
Check Valve 230

Figure 1B:
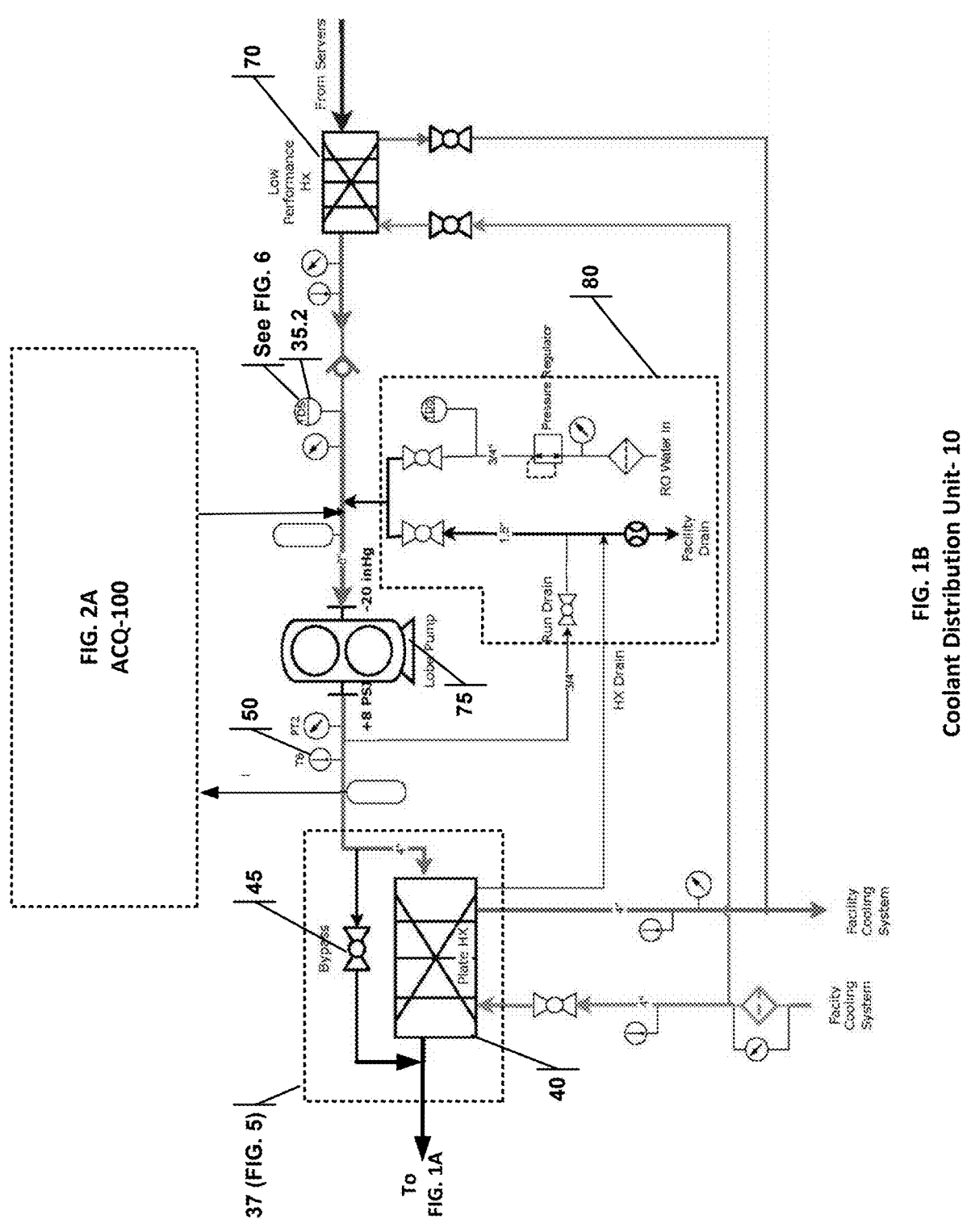
FIG. 1B is a schematic showing a second portion of the CDU.
Figure 1C:
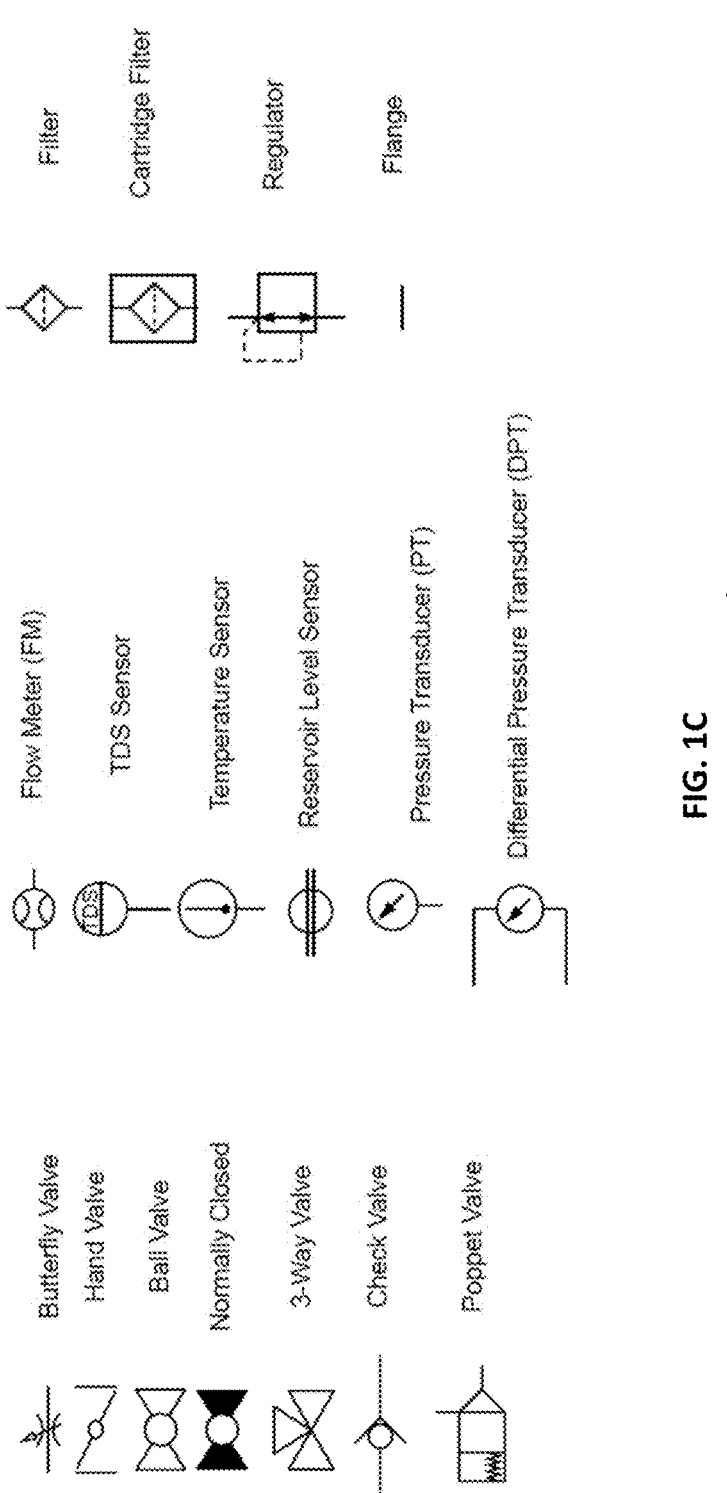
FIG. 1C is a legend for FIGS. 1A and 1C.

A coolant distribution unit 10 shown in FIGS. 1A and 1B is operated under negative pressure. A coolant reservoir 17 holds the coolant, while the vacuum pump 20 maintains the CDU under negative pressure. A coolant level sensor 17 provides the coolant level to the processor 65 (not shown). Should the coolant level drop below a threshold level, the processor 65 may actuate the coolant refill and drainage subsystem 80 to add the appropriate amount of coolant. Coolant flows from the reservoir 17 to the servers (or other heat-generating components) where the coolant flows through individual heat exchangers within the servers to evacuate the heat. The now-hotter coolant is pulled by the lobe pump 75 back to the CDU 10.

The lobe pump 75 is particularly susceptible to cavitation because the CDU operates at negative pressure and the coolant is at high temperature. Cavitation reduces the efficiency of the pump 75 and may damage the pump 75. Therefore, prior to the pump 75, a low performance heat exchanger with a low flow resistance 70 may be used to drop the temperature of the coolant to mitigate cavitation. For example, a temperature reduction of the incoming water from 65 C to 60 C reduces the boiling pressure of the water by 1.4 in Hg and the heat exchanger may have a pressure drop of 0.4 in Hg, thereby increasing the available delta pressure by 1 in Hg.

Figure 6:
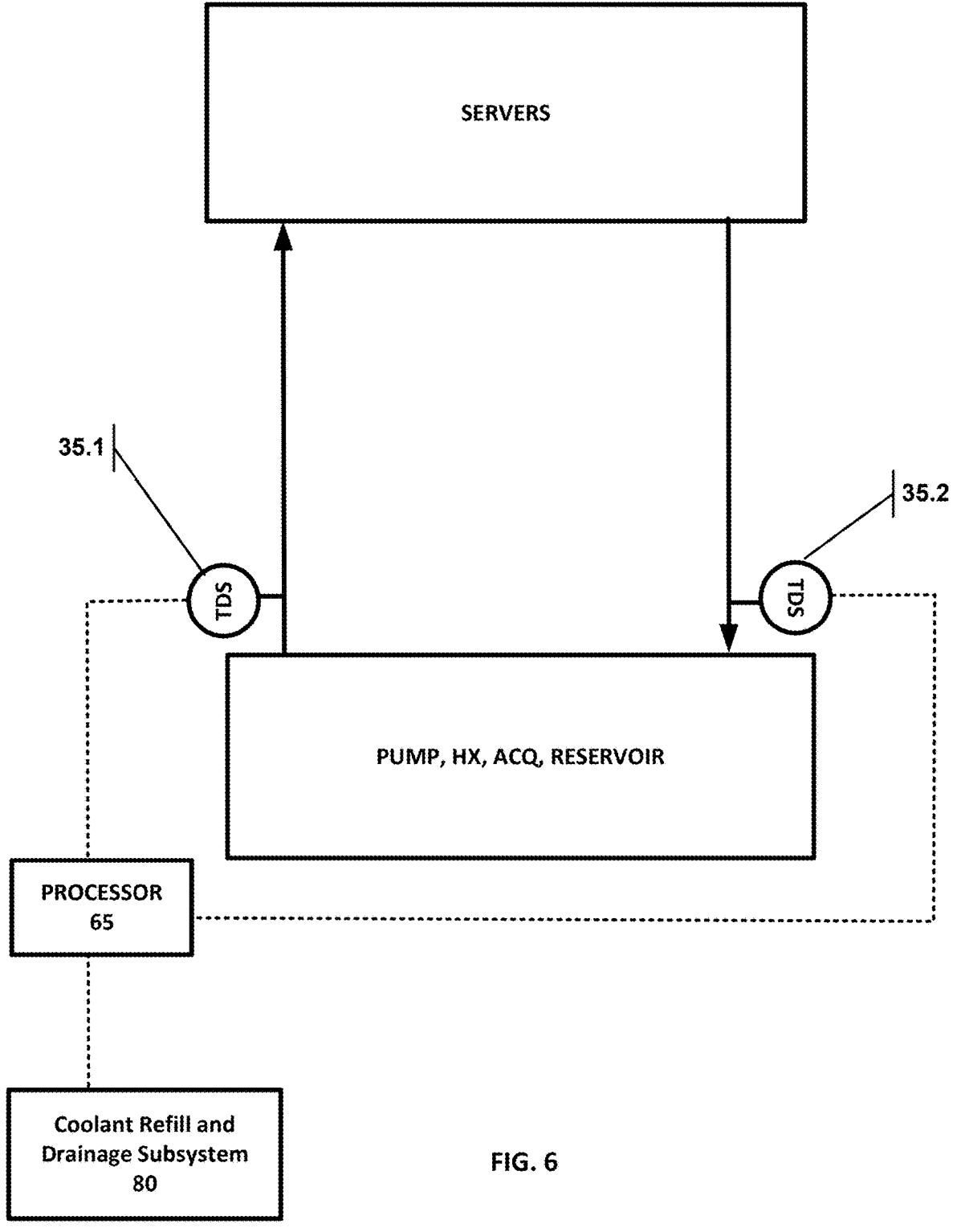
FIG. 6 is a schematic of the Total Dissolved Solids detection and measurement subsystem of the CDU.

When adding a server to the CDU, contamination may be introduced that should be addressed immediately to maintain high coolant quality. FIG. 6 illustrates a subsystem that monitors total dissolved solid (TDS), and/or turbidity (total suspended solids, TSS) immediately after the coolant reservoir 15. TDS sensor 35.1 measures the TDS levels exiting the reservoir 15 and sensor 35.2 measures the TDS after the coolant has traveled through the servers. If a contaminated server is added, the differential TDS measurement between sensors 35.1 and 35.2 may be detected by the processor 65, and if it is above a threshold, the processor may initiate an aggressive coolant change through the coolant refill and drainage subsystem 80 to reduce the TDS. The change could include adding about 5% of the system volume with fresh coolant or water and draining of a 5% of the system volume periodically until the coolant was replaced by 90-95% fresh coolant. At this point, the biocide and anti-corrosion additives would be added to the system at the correct dose. During this "Bleed and feed" process, the cooling continues unabated.

The pump 75 propels the coolant to the heat exchanger bypass subsystem 37. In modern data centers, the temperature in the coolant can change dramatically in a very short time. For example, if a bank of servers is dedicated to a particular artificial intelligence computation, the heat generated can be high. But the moment that computation is completed, the servers no longer generate the high heat, and the coolant temperature can drop quickly. If that cold coolant is allowed to flow through back through the severs unchecked, it may be so cold as to cause damaging condensation on the cold plates within the individual servers.

Figure 5:
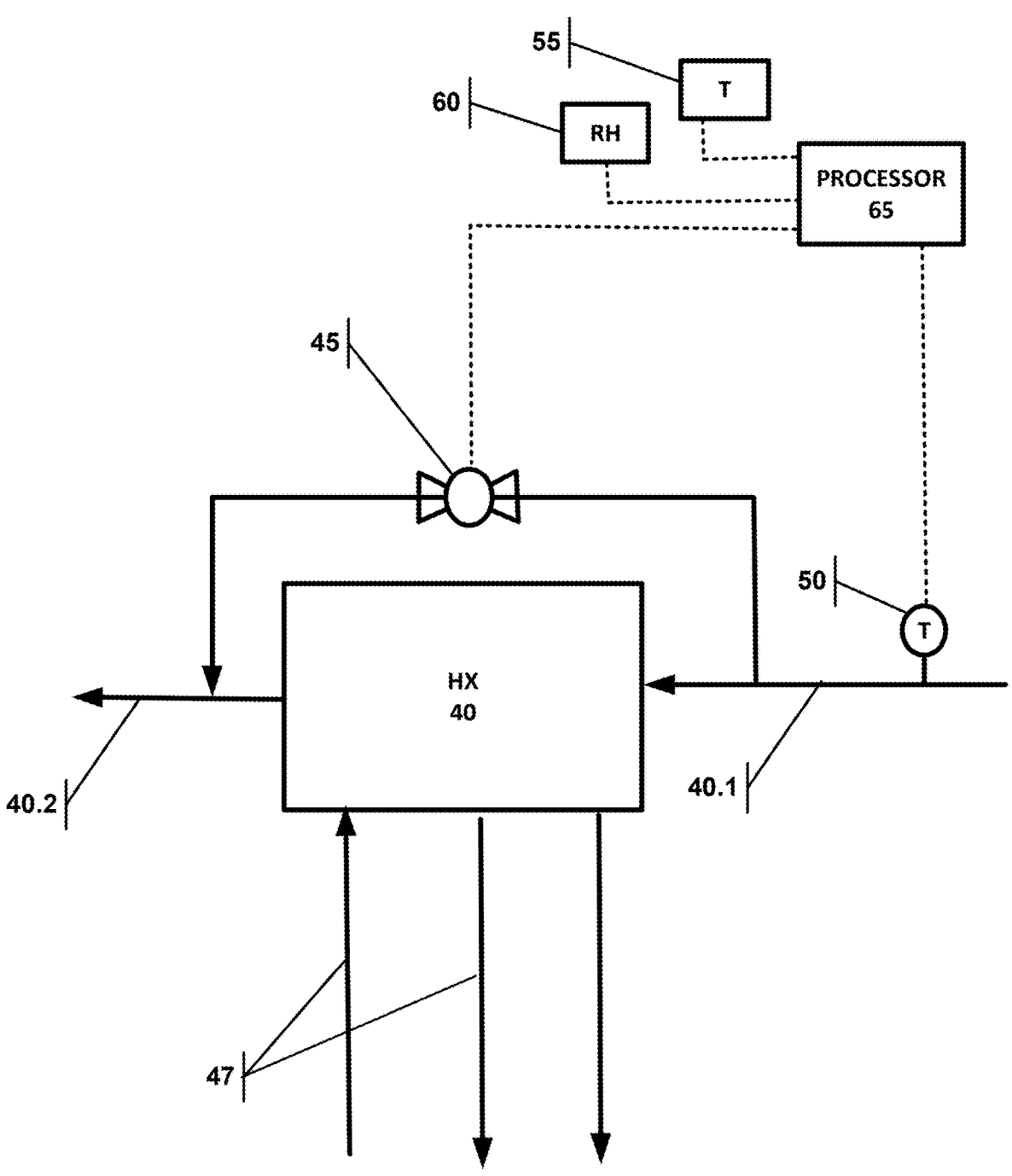
FIG. 5 is a schematic of the heat exchanger bypass subsystem of the CDU.

To mitigate this problem, a heat exchange bypass subsystem 37, shown in FIG. 5, may be used. During normal operation, bypass valve 45 is closed such that all the coolant flows through the pre-exchanger coolant conduit 40.1 into the primary heat exchanger 40 removing the heat through fluid lines 47 connected to the facility cooling system, then output to the post-exchanger coolant conduit 40.2. When temperature sensor 50 detects a reduction in temperature, the processor 65 may open the bypass valve 45 (connecting the pre-exchanger coolant conduit 40.1 to the post-exchanger coolant conduit 40.2) to allow a portion of coolant to bypass the primary heat exchanger 40, resulting in a warmer coolant delivered to the servers-mitigating condensation. The processor 65 may have an ambient temperature sensor 55 and an ambient relative humidity sensor 60 that measure the temperature and relative humidity within the server room environment. These sensors allow the processor 65 to determine the dew point (i.e., the temperature at which condensation may occur) and actuate the bypass valve 45 to maintain a coolant temperature that is above the determined dew point. A server power measurement may be used in addition to the temperature measurement to predict the drop in cooling load and actuate the bypass valve.

From the heat exchanger bypass subsystem 37, the coolant travels back to the reservoir 15. To reduce biological material fouling, the CDU may include a side stream filtration system to capture biological material. A one-micron filter 28 placed on a side stream (diverting approx. 5% of the coolant flow) may be installed to decrease biological growth. A differential pressure transducer 25.3 installed on either side of the filter 28 may be used to determine the need for replacement of the filter when the pressure exceeds a threshold compared to baseline at installation. The processor 65, connected to the differential pressure transducer 25.3, may alert operators of the need for filter replacement. Valves 30.5 and 30.6 may be closed to replace the filter 28 when required.

The larger portion of the coolant flow may also pass through filters 27 with a larger filtration size—e.g. 50 microns. Differential pressure transducers 25.1 and 25.2 installed on either side of the filters 27.1 and 27.2 may be used to determine the need for replacement of the filters when the pressure exceeds a threshold compared to baseline at installation. In operation, coolant flow is limited to either filter 27.1 or filter 27.2 or both. The processor 65, connected to the differential pressure transducers 25.1 and 25.2, may alert operators of the need for filter replacement. If, for example, differential pressure transducer 25.1 indicates that filter 27.1 needs replacement, then valves 30.1 and 30.2 may be closed and valves 30.3 and 30.4 opened. Filter 27.1 can then be replaced without a disruption to the CDU.

A UV sterilizer 32 may also be used to treat biological fouling, specifically planktonic bacteria. This sterilizer 32 is shown as part of the side stream following the biological material filtration (@ 1 micron) 28. The sterilizer 32 includes a transparent region 160 on the coolant conduit 155. As coolant flows 150 through the transparent region 155, it is exposed to UV light 185 to kill the bacteria. A UV sensor/camera/photocell detects algal or other biofouling of the transparent region 160. A degradation in the sensor/camera/photocell signal will prompts alerts to the operators that indicate a cleaning is necessary. The sensor/camera/photocell signal would also alter if the UV light 185 is no longer operational. The sensor/camera/photocell 190 may be connected to the processor 65, which may take automated action to injected necessary additives and/or perform a coolant change. The UV sterilizer is shown as a side stream treatment.

In addition to the filtration and UV treatments, the automatic coolant quality (ACQ) subsystem 100 may be used to further improve coolant quality, and thus CDU performance. Because the coolant flows over cool and warm metal surfaces, the coolant can undergo chemical reactions that lead to the formation of precipitate, scale and other solids that interfere with the heat transfer, pumps and/or valves. The coolant may also corrode metals in the CDU or react with plastics. Also, any system that is periodically exposed to the environment may admit dust, dirt and biologicals (algae, bacteria, fungi) that may colonize and cause reduced CDU performance. The ACQ is designed to control and eliminate these problems.

The ACQ 100 may take a side stream of the coolant flow from the main trunk of the coolant circuit as shown in FIG. 1B. Referencing FIG. 2A, the details of the ACQ 100 are shown. As coolant enters the ACQ 100 through coolant conduit 155, it passes through a filter 27 with a differential pressure transducer 25.4 installed on either side of the filter 27, to determine the need for replacement of the filter when the pressure exceeds a threshold compared to baseline at installation. The processor 65, connected to the differential pressure transducer 25.4 may alert operators of the need for filter replacement. Valves 30.7 and 30.8 may be closed, without interrupting the CDU operation, to replace the filter 28 when required.

An initial (or upstream) bank of sensors connected to the processor 65 evaluates the coolant quality. Those sensors may include a TDS sensor 35.3 (measures the amount of ions in the water as a measure of coolant cleanliness and as an indicator of the presence of water additives), an oxidation reduction potential sensor 105 (measures the total amount of oxidizing substances present in the coolant) and a pH sensor 110 (a measure of water quality used to indicate when coolant in the system should be flushed out and replaced). The coolant then flows through orifice/flow controller 130 that restricts the flow to allow the sensors to be on the positive pressure side of the orifice and the chemical addition to be under a negative pressure system. Sensors may not be designed for negative pressure, so they are under positive pressure. Adding chemicals under negative pressure reduces the need for individual pumps. For use in a positive pressure system a single pump downstream of the coolant additive connections can provide the necessary negative pressure to add the chemicals. Pressure transducer/sensor 135 may be used to determine how quickly the additives will enter the coolant.

Figure 2A:
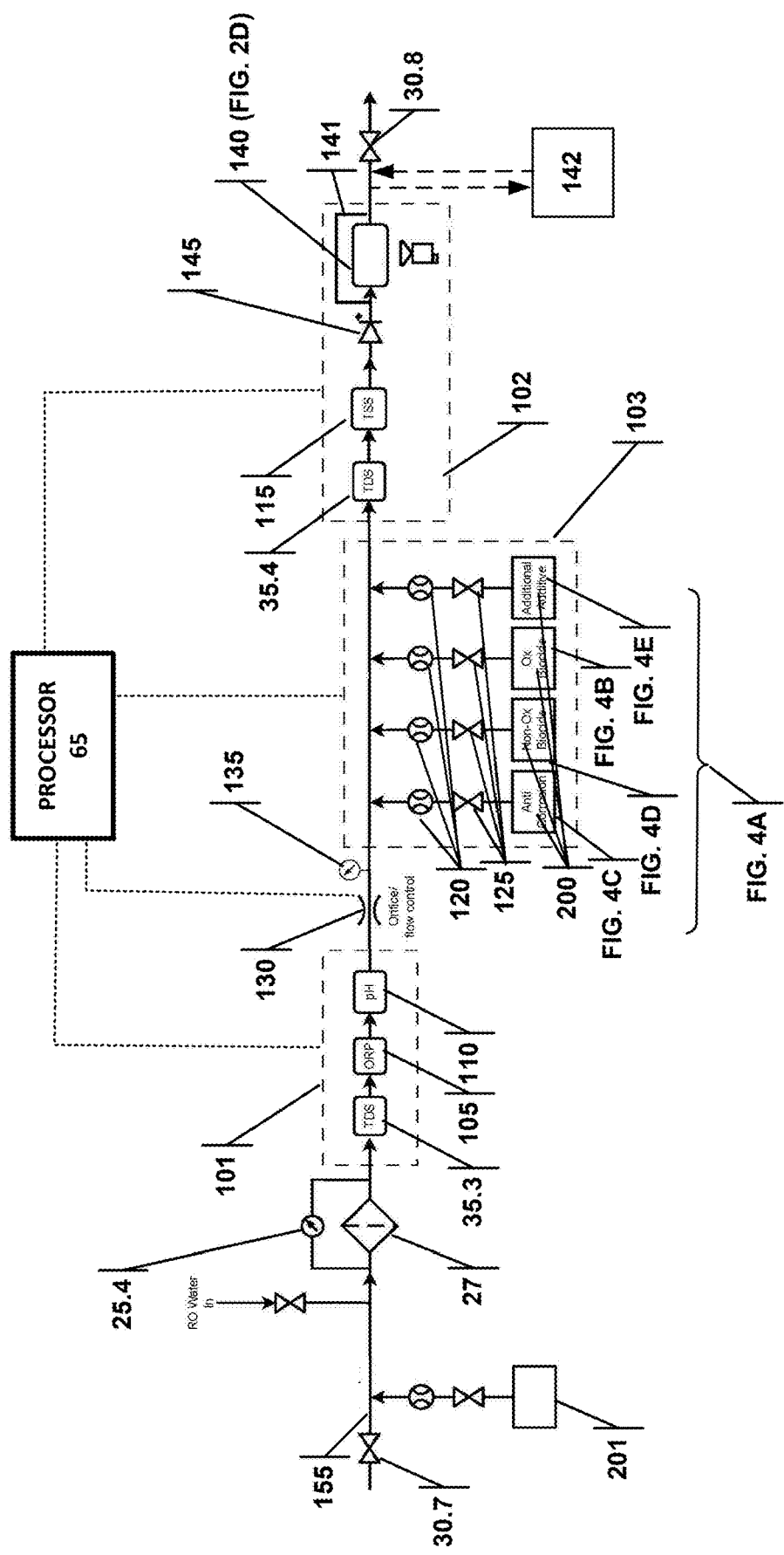
FIG. 2A is a schematic of the automatic coolant quality (ACQ) subsystem of the CDU.
Figure 2C:
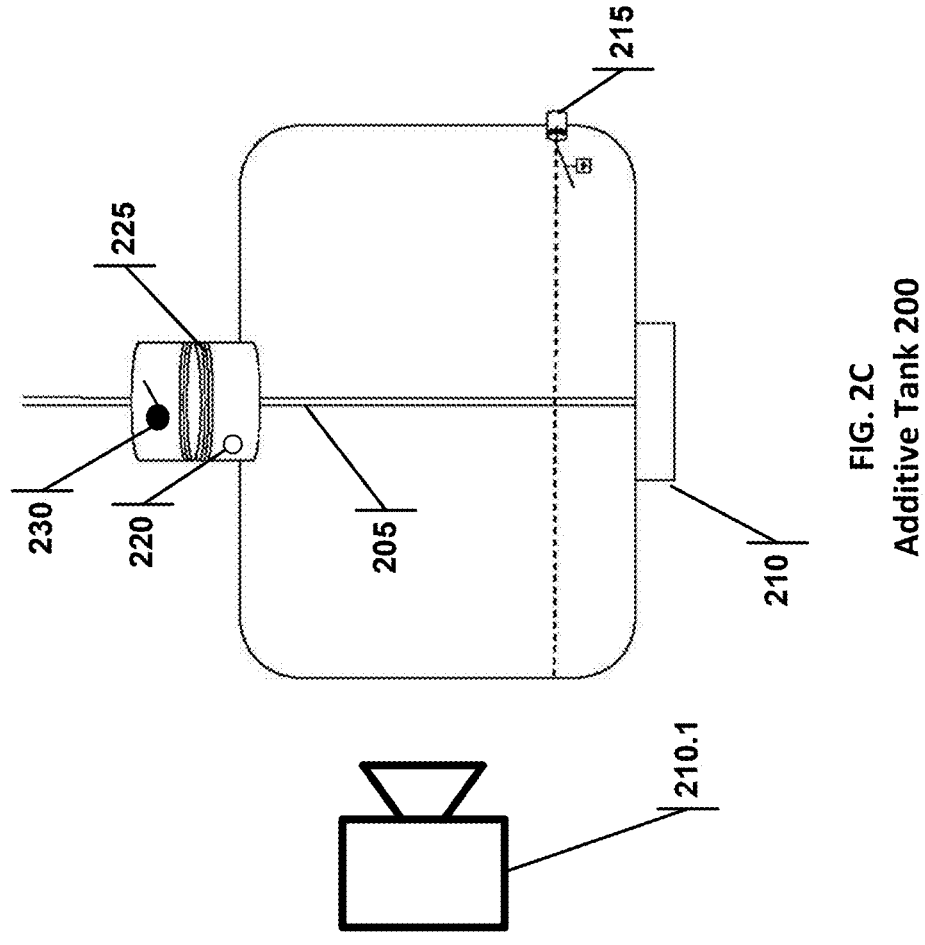
FIG. 2C illustrates a tank for additives used in the ACQ subsystem.
Figure 2B:
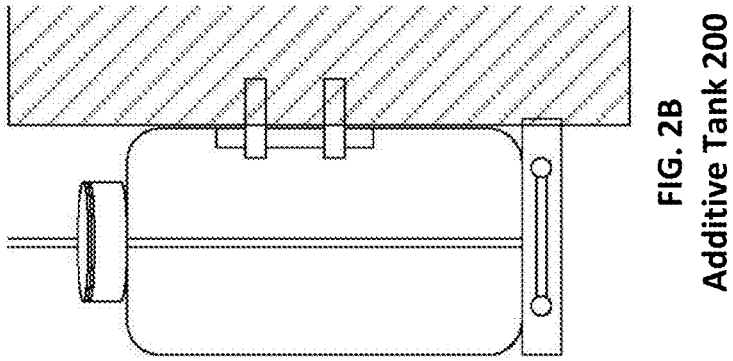
FIG. 2B illustrates a tank for additives used in the ACQ subsystem.

The coolant then travels through the additive injection subcomponent 103 that includes one or more additive injection branches (four such additive injections are shown in FIG. 2A). Each additive injection branch includes a flow meter 120 to measure the amount of additive injected, a valve 125 to control the release of the additive, and an additive tank 200 (more generally an additive container). The flow meter 120, the valve 125, and the tank 200 may be connected to the processor 65 to automate the additive dispensing. The preferred structure of the additive tanks 200 is detailed in FIGS. 2B and 2C. A load cell 210, connected to the processor 65, reports the fluid level of the additive to confirm/verify additive dispensing. Alternatively, or in combination with the load cell 210, a camera 210.1 may be used to determine the additive tank levels. The load sensor and/or camera are also referred to herein as an additive mass sensor. A level switch 215, also connected to the processor 65, may be used to sense a low level of additive. The tank 200 may include a dip tube 205 to draw the additive out of the tank, through a check valve 230. A vent 220 opens the additive tank 200 to ambient pressure. The vent 220 may be connected to an additional tank at ambient pressure where additive vapors can safely be integrated into the system. A filter 225 made of activated charcoal or other material to prevents the additive vapor from being released through the vent 220. The amount of chemical added as measured by multiple sensors must agree, or an error message is generated and sent to the operators. The additive tank 200 may be a bag that collapses as the additive is depleted, thereby obviating the need for a vent.

After the additive injection, the ACQ may include a TDS or conductivity sensor 25.4 to verify the injection of chemical additives into the coolant stream, a turbidity or total suspended solids (TSS) sensor 115 to measure the amount of particulate matter in the coolant stream, a photo diode 145 to measure the amount of copper in the coolant stream, and an optical monitoring subsystem 140. For example, a laser diode can illuminate a coolant stream and a photodiode can determine how much of the light is absorbed. Various wavelengths of light can be used to detect additives or contaminants. The coolant stream may be in the form of a free surface waterfall so that the windows on the light source and light sensor do not require periodic cleaning. The waterfall may also be used with the UV light treatment to prevent fouling of the window.

Figure 2D:
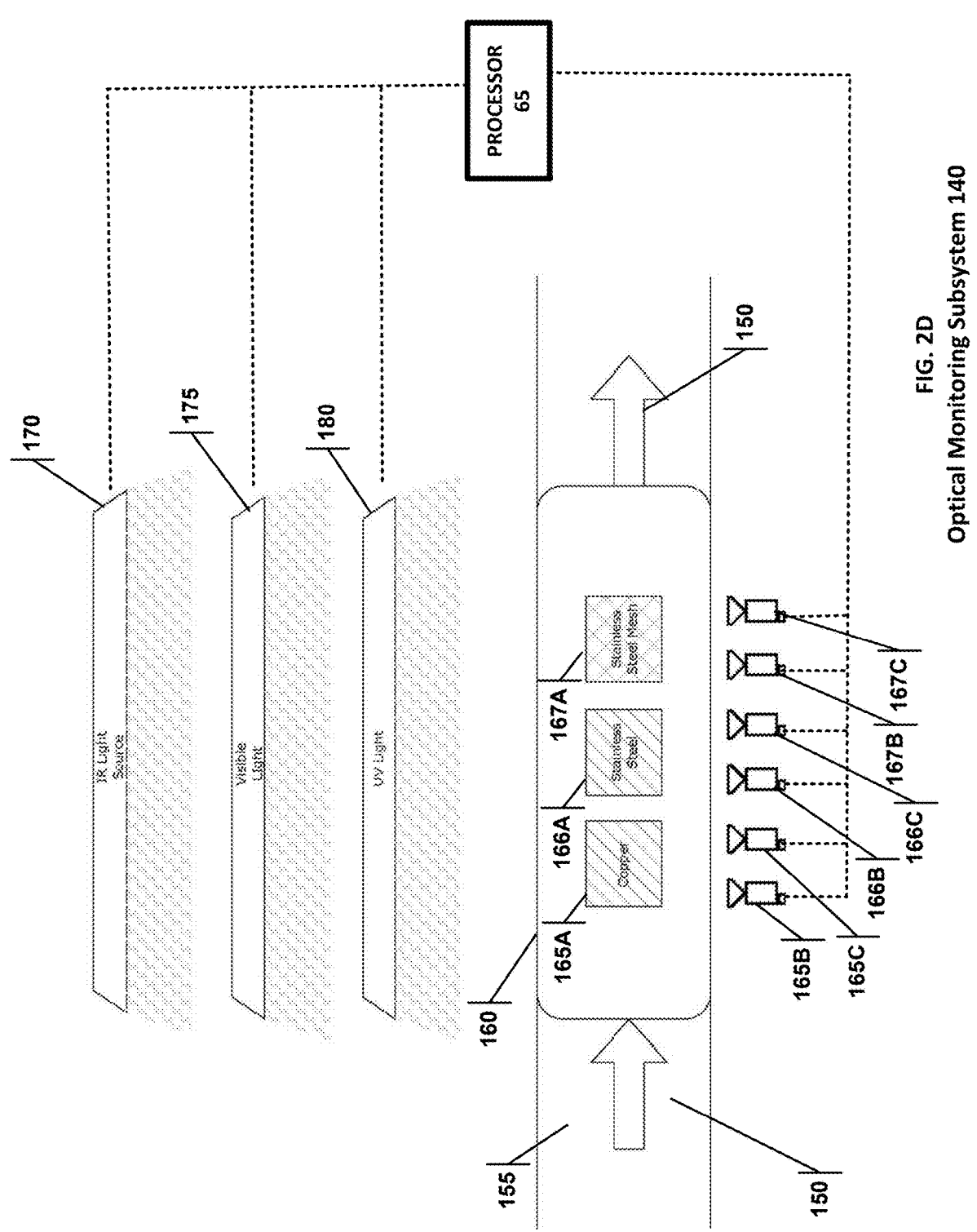
FIG. 2D illustrates the optical monitoring subsystem used in the ACQ subsystem.
Figure 2E:
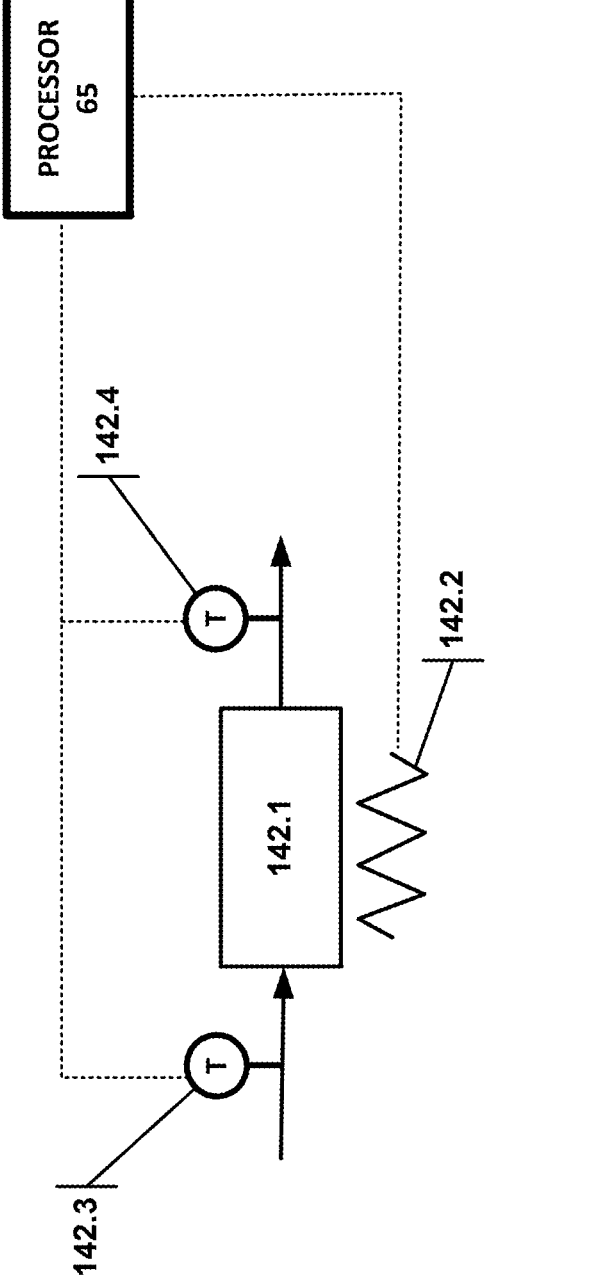
FIG. 2E illustrates the heat transfer sensor used in the ACQ subsystem.
Figure 3:
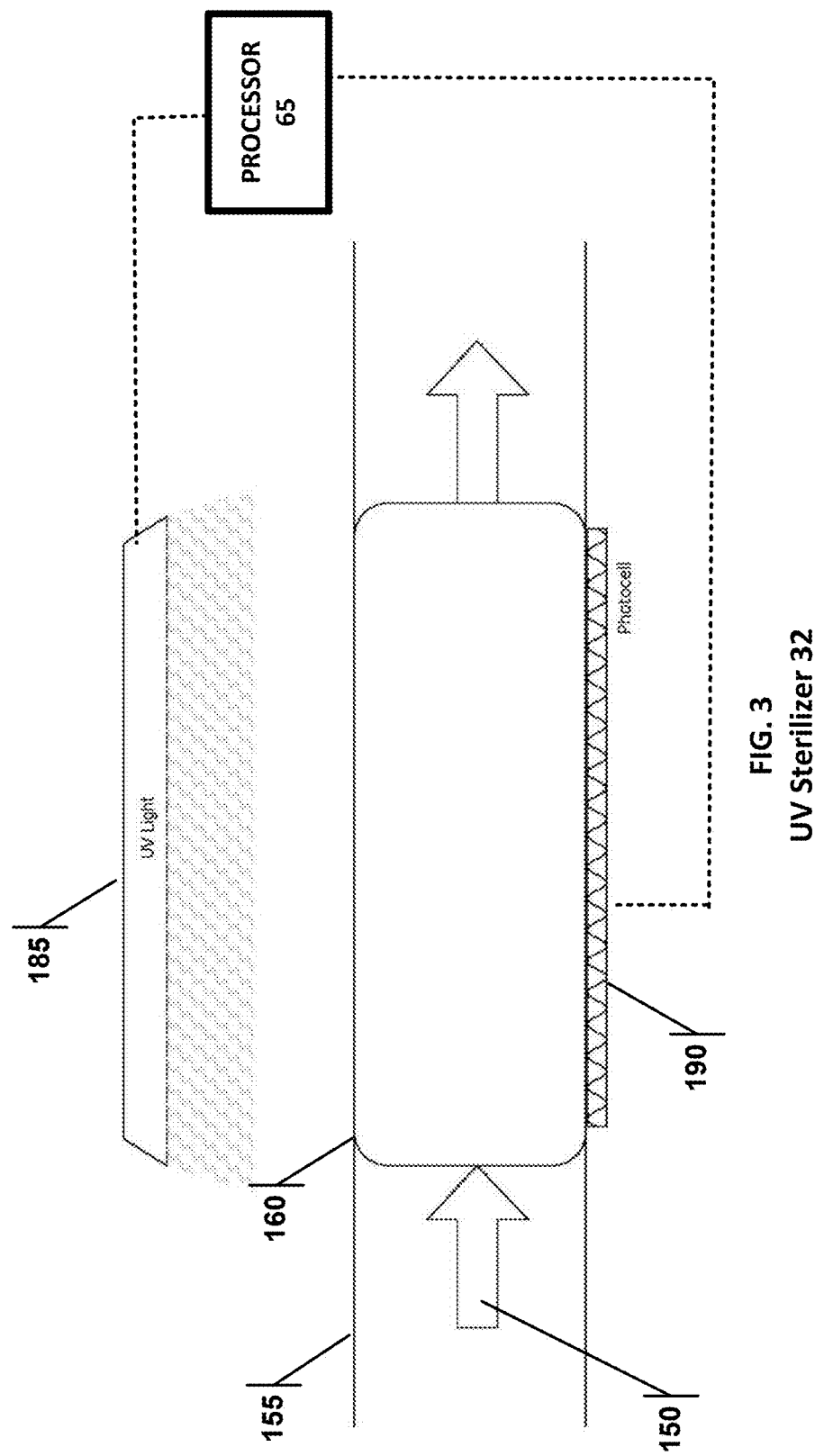
FIG. 3 illustrates a UV sterilization subsystem.

The processor 65 may monitor the TSS sensor 115 for changes in turbidity as a function of time and actuated chemical treatment which may include an increase in oxidative and non-oxidative biocide addition, the injection of algaecide, or a high biocide dose followed by a rapid fluid exchange of the entire system. A heat transfer sensor 142 may also be used to assess the condition of the heat exchangers (cold plates) within the servers. Such a sensor uses the same heat transfer rate, same material and same flow velocity as the heat exchangers (cold plates) within the servers. A reduction in heat transfer in the sensor 142 implies a loss of system performance and the need to change the coolant and the additives. Shown in FIG. 2E is a schematic of a heat transfer sensor (dummy cold plate) 142. It may include a cold plate 142.1 with a heater 142.2, an input coolant temperature sensor 142.3 and an output coolant temperature sensor 142.4. These components are connected to the processor 65, which can actuate the heater to provide a know amount of heat to the cold plate 142.1. By knowing the flowrate and the input and output temperature, the processor 65 can determine if there is loss in performance that may require a coolant change or introduction of additives.

Rapid exchange of coolant in the CDU may be required on occasion by an increase in the bleed and feed mode of operation. The speed at which this may occur is a function of the reserve feed water and ability to make new clean water through the reverse osmosis (RO) system. This logic may be programmed into the processor 65 to exchange the water as rapidly as possible and not exhaust the reserve. A pressure sensor may be used to determine the exhaustion of RO water.

It may be necessary to administer larger doses of oxidizing and non-oxidizing biocides for excessive biological growth scenarios as determined by the optical monitoring subsystem 140. This subsystem 140 includes a transparent region 160 on the coolant conduit 155. As coolant flows 150 through the transparent region 155, the coolant contacts one or more coupons made of materials of interest. Preferably, a copper coupon 165A, a stainless-steel coupon 166A and a stainless-steel mesh coupon 167A may be used. The transparent region 160, and consequently the coupons, may be illuminated by one or more light sources. Preferably, an infrared light source 170, a visible spectrum light source 175 and an ultraviolet light source 180 are used. Sensors, preferably corresponding with the wavelengths of the light sources, may be used to monitor the condition of the coupons. Shown in FIG. 2D are a set of sensors (visible and IR) for the copper coupon (165B, 165C), for the stainless-steel coupon (166B, 166C) and the stainless-steel mesh coupon (167B, 167C). The number of sensors and the number of coupons may be varied depending on the system requirements. A bypass 141 with appropriate valves may be added to clean the optical monitoring subsystem 140 or replace the coupons, without having to shut down the entire CDU.

Monitoring the sensors for color changes in the copper or growth of biofilms on any of the metals may be accomplished by either daily transmission of images to operators or with machine learning algorithms to detect visible changes in coupons. The results of the visual analysis may lead to specific dosing changes that may include a decrease in oxidative biocide addition, an increase in oxidative and non-oxidative biocide addition, the injection of algaecide, or a high biocide dose followed by a rapid fluid exchange of the entire system and redosing of corrosion inhibitors.

Some of the factors that may degrade coolant quality and thermal performance of the CDU include scale buildup, bio growth, excessive corrosion, unanticipated chemical reactions, addition of low-quality makeup water, addition of new contaminated server systems to CDU, and sudden extreme swings in measured parameters. Chemical additives may be used to mitigate or reverse these factors, and include corrosion inhibitors (including but not limited to azoles, chlorinated azoles, molybdate ion), oxidizing biocides (including but not limited to sodium hypochlorite, monochloramines), non-oxidizing biocides (including but not limited to isothiazolinones, methyl isothiazolinones, chloromethyisotiazolinones, quaternary ammonium compounds, EDTA, BNPD), algaecides (including but not limited to copper ethanolamine complexes, copper sulfate, quaternary ammonium compounds), and descalers (including but not limited to Nu-Calgon Scale Remover 4330-08 or QwikDESCALER+ from Mainstream Engineering or citric acid). The algaecide may be needed if the local biome is susceptible to algae blooms. These additives may have a color indicator added, such that optical measurement of this color in the coolant stream indicates the concentration of the additive.

Corrosion inhibitors may be added automatically from the ACQ to maintain a concentration in the proper range according to dilution equation and specific additive. Tolytriazoles may target for a concentration of approximately 40 ppm in the fluid of the CDU. Other azoles or combinations of azoles may also be used with specific concentrations defined by inhibition properties as reported by vendors. Proof of injection is determined 1) by measuring mass of the corrosion inhibitor tanks before and after injection, 2) by measuring and the difference in the TDS in the ACQ side flow loop between the sensors on either side of the injection manifold, 3) detection of an increase in pH after a period of three total system volume flows for corrosion inhibitors stabilized with strong bases.

Corrosion inhibitors may be added at; 1) regular intervals, 2) with addition of new server racks, and 3) after the execution of a strong oxidizing biocide treatment. The interval for frequency additions is determined by calculated decrease in concentration as a function of the bleed and feed programming of the CDU.

Oxidizing biocides may be added to maintain a concentration of approximately 1-3 ppm for steady state operation. Periodic injection timing of oxidizing biocides may be determined by dilution calculations as a function of the bleed and feed programming of the CDU. Proof of injection of the biocide may be determined 1) by measuring mass of the biocide tanks before and after injection, 2) by measuring and the difference in the TDS in the ACQ side flow loop between the sensors on either side of the injection manifold, 3) detection of an increase in pH after three total system volume flows, and 4) detection of an increase ORP value. This provides redundant confirmation where missing confirmation values trigger alerts sent to operators.

Another method of determination of the need for larger oxidative biocide dosing may be a significant increase in the TSS value from that sensor. A measurable change in the images of the coupons or decrease in turbidity may indicate success of biocide treatment.

Larger oxidizing biocide doses may reach in the range of 50 ppm in extreme cases. The volume of injection to achieve this is determined by the processor 65. These larger oxidative biocide injections may require an adjustment to the bleed and feed programming to bring the ORP back to initial levels within 24-72 hours.

Larger oxidizing biocide injections may be monitored as a function of time to determine the need for repetition. Colonies of bacteria, fungi, or algae may consume oxidizing biocide at a higher rate than baseline. This is evidenced by a rapid decrease in ORP (from high negative millivolts to low negative or positive millivolts) after injections and may indicate the need for more treatment. Continued larger injections may be necessary when the rate of ORP decrease plateaus, the bleed and feed programming is increased to return system to ORP parameters associated with 1-3 ppm oxidizing biocide levels.

Non oxidizing biocides injections may include chemical such as isothiazolinones, EDTA, BNPD at appropriate concentrations depending on the active ingredient. Proof of injection is determined 1) by measuring mass of the corrosion inhibitor tanks before and after injection, 2) by measuring and the difference in the TDS in the ACQ side flow loop between the sensors on either side of the injection manifold, and 3) detection of an increase in pH after three total system volume flows. Periodic dosing of system with non-oxidizing biocides may be achieved with injection timing logic or visible evidence from optical monitoring subsystem 140. As an example, a baseline dosing of a combination of isothiazolinones (CI, MCI) at a system concentration of 100 ppm is a reasonable dosing requirement.

Algaecides such as copper sulfate or copper ethanolamine complexes may be added in a similar manner at very low concentrations (single digit ppm of active ingredient). Proof of injection is determined 1) by measuring mass of the corrosion inhibitor tanks before and after injection, 2) by measuring and the difference in the TDS in the ACQ side flow loop between the sensors on either side of the injection manifold, 3) detection of an increase in pH after three system volume mixes, and 4) feedback from photodiode programmed to detect light at 870 nm. Periodic dosing of algaecides may be required every other week if problems become evident through observation by the optical monitoring subsystem 140.

The CDU may use occasional high temperature episodes for biocidal purposes. The CDU may be designed to run at 50 C for 30 minutes to kill all bacteria. This may cause servers to throttle, but with this approach, the need for a biocide is minimized.

Over time, the copper surfaces in the liquid cooling system may need to be cleaned due to minerals in the coolant plating or scaling on the inside of the cold plates. This could cause flow restrictions and reduce thermal performance. The period needed for cleaning will depend on the quality and temperature of the coolant and the heat flux of the system. One descaler that can be used is Nu-Calgon Scale Remover 4330-08. It is mostly hydrochloric acid with inhibitors to make it safe with copper. For server cleaning, 16 oz (473 mL) was used to clean each CDU loop. This dropped the pH to below 2. Citric acid can also be used to remove the scale. Inhibitors will reduce the tendency of the acid to dissolve metal surfaces. The system may alert the user when a descale process is needed, so the user can be ready with replacement filters if the filter clogs during the descale process. The heat transfer sensor 142 (i.e., a dummy cold plate) or the optical monitoring subsystem 140 may be used to indicate when it is time to descale. The descale process is manual, as it is not needed unless the level of calcium or magnesium in the coolant is too high, which should not occur during typical operation.

The system may gather, store, and transmit all sensor, chemical injection, flow, and temperature data captured by the ACQ and CDU system. This may be fed into a machine learning system for algorithm improvement and modification.

A TDS sensor on input verifies the quality of input coolant. If the coolant is found to have a TDS of above 50 ppm, the CDU will shut off input flow and send alerts to operators.

The CDU coolant volume is determined during the initial filling process by calibrating the fill rate based on an internal level sensor 17 in the system reservoir 15. For example, if the internal reservoir level increase by 10 liters in one minute, the inlet flow rate is 10 liter/minute, and the amount of water added to the system may be determined based on the duration of the fill valve opening during the initial fill and commissioning of the liquid cooling system which will include the volume within the cooling pump and reservoir and the volume of the associated electronics and cold plates. This assumes that the fill water pressure is constant. The fill water pressure ahead of a fill valve can be controlled using a water pressure regulator. A typical setting would be 10 psi, so that the pump inlet need not be designed for high pressure. The amount of water added to the system is recorded whenever the system is refilled, and this data is used to control the additive system to maintain the correct concentration of coolant additives. A flow regulator in line with the fill valve may also be used to determine the system volume and volume of coolant added by measuring the time to fill for a known flow rate determined by the flow regulator. As server racks and their additional plumbing are added, the same technique will be implemented to account for an increase in total system volume and adjust injection volumes of additives to maintain them at proper levels.

The CDU also includes a fill valve connected to a reverse osmosis (RO) filter system or other low conductivity (low total dissolved solids) water or coolant supply and a drain connection (shown as the coolant refill and drainage subsystem 80). The CDU can therefor automatically replace the coolant in the system with fresh coolant and reduce the problem of slightly soluble chemicals creating precipitate or slow growing bacteria propagating throughout the system. The coolant is replaced by draining 5-10% of the coolant, refilling with RO water or coolant, and then draining another 5-10% until 90% of the coolant has been replaced. This will typically take 2× the fluid volume of the system. The system must deal with dirty racks added on and respond by purging the coolant. A sudden need for more coolant, a change in ORP, TDS, pH, or turbidity would lead to a flush and descale operation. It could also be activated by the user. 25% propylene glycol in water with anti-corrosion additives may be used instead of RO water.

The CDU can also provide periodic cleaning of sensor loop with acid. A descale tank can be placed in the entry portion of the flow loop (see 201, FIG. 2A) so that everything downstream can be cleaned and descaled. The descaler fluid may be vented into the liquid cooling system vent system so that any acid vapors do not cause corrosion or damage to the electronics or steel frame. The coolant additives may also be placed in sealed flexible bags to prevent vapor release or fluid contamination.

Injections to the system may be determined using the dilution equation:

$$C_1V_1 = C_2V_2$$

where C1 is the concentration of azoles in concentrated solution, V1 is the volume of addition, C2 is the concentration of azoles in the system, and V2 is the CDU volume of system.

The CDU is programmed with a periodic drain to waste and automatic refill with clean RO water from the facility. This "bleed and feed" system is used in calculations to maintain proper additive concentrations which are also monitored with pH, ORP, turbidity, and TDS values.

Injection volumes are determined by timed valve opening against approximately 4" Hg of vacuum. Flow rates through the valves may be determined empirically and programmed into the ACQ system. Injection volumes may also be determined by mathematical methods as a function of orifice size of valve, sensing differential pressure between ACQ side stream loop and the storage tanks, viscosity of the fluid, to determine valve opening times. It is also possible to use positive pressure injection through actuated volumetric slug injectors or peristaltic pumps into the flow stream.

Figure 4A:
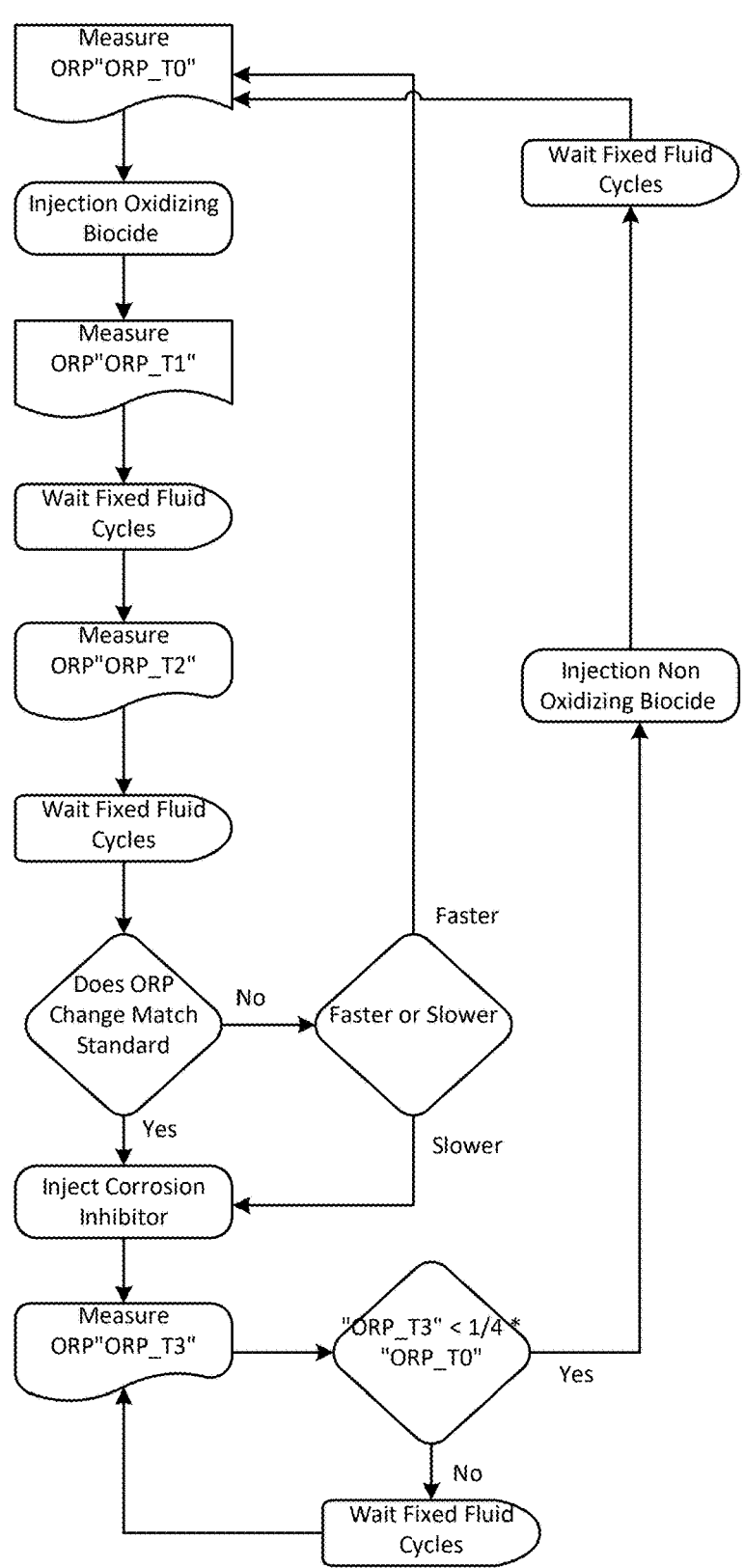
FIG. 4A is a flowchart for the biocide injection routine used in the ACQ subsystem.

Referencing FIGS. 4A through 4E, exemplar methods for additive injection and confirmation are disclosed. FIG. 4A presents the biocide and corrosion inhibitor routine. Optimally, the CDU should start with a clean system and clean water (ASTM Type 4 water specification minimum) with corrosion inhibitor added to achieve calculated target concentration and confirm injection with injection confirmation routine. Record the baseline pH, ORP, and TDS ("ph_T0", "OPR_T0", and "TDS_T0"). Then execute the oxidative biocide injection routine (FIG. 4B) to achieve the calculated target concentration and confirm injection with injection confirmation routine. Then record pH, ORP, and TDS ("pH_T1", "ORP_T1", "TDS_T1") and cycle the CDU for a fixed period. Then record pH, ORP, and TDS ("pH_T2", "ORP_T2", "TDS_T2") and cycle the CDU for a fixed period. Check the slope of ORP values from "ORP_T0", "ORP_T1", and "ORP_T2". If the slope matches known curves for the CDU, initiate another corrosion inhibitor injection routine and confirm injection (FIG. 4C) and let run for a period (approximately two weeks). Then conduct the non-oxidative biocide injection routine (FIG. 4D) and confirm injection.

If the ORP slope, however, is steeper than known curves for the CDU (ORP becomes more negative faster), initiate another corrosion inhibitor injection routine and confirm injection (FIG. 4C), and let run for a period (approximately two weeks). Then conduct the non-oxidative biocide injection routine (FIG. 4D) and confirm injection.

If the ORP slope, however, is less steep than known curves for the CDU (ORP does not become more negative than projection), repeat the oxidative biocide injection routine until ORP value is within specification. Then initiate another corrosion inhibitor injection routine and confirm injection (FIG. 4C), and let run for a period (approximately two weeks). Then conduct a non-oxidative biocide injection routine (FIG. 4D) and confirm injection.

The system should be monitored for relative changes in ORP with measurements every 12 hours ("ORP_T3"). When "ORP_T3" is approximately 25% of "ORP_T0", then initiate non-oxidative biocide injection routine with injection confirmation routine (FIG. 4D). Run the system for a period equal to time required for oxidative biocide depletion to 25% of initial value (which initiated the non-oxidative biocide injection). Then repeat the biocide and corrosion inhibitor routine. If during operation either, turbidity increases above threshold as measured by the TSS 115 sensor or the optical monitoring subsystem 140 indicate growth on the coupons, perform oxidative biocide routine followed immediately by non-oxidative biocide injection. Optionally, the algaecide injection confirmation routine shown in FIG. 4E may be included to combat bio-growth.

Figure 4B:
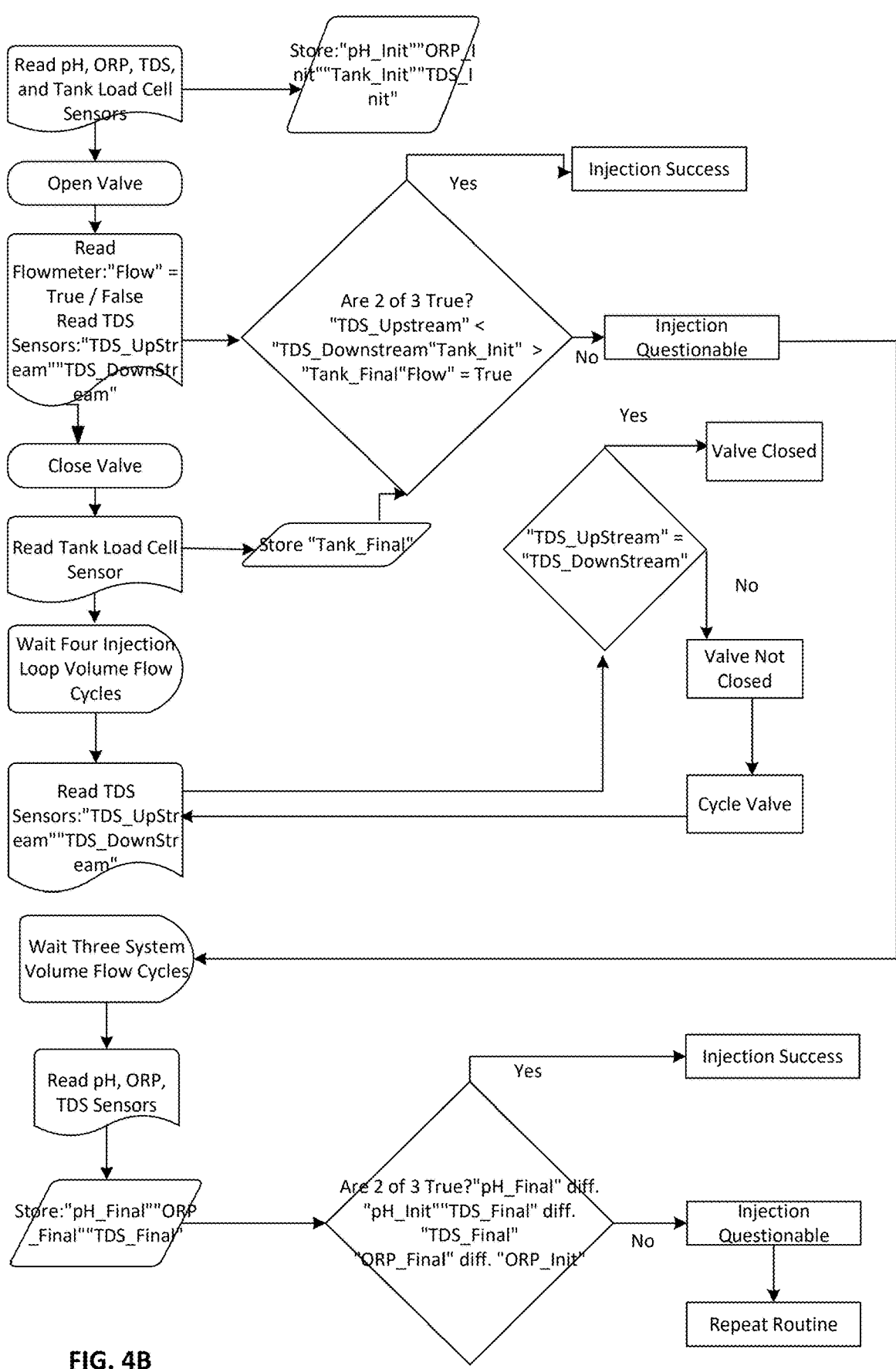
FIG. 4B is a flowchart for confirming the injection of the oxidizing biocide during the biocide injection routine.

In FIG. 4B, before an oxidizing biocide injection routine is called for, the following sensors are read and values stored in software: load cell 210 on oxidizing biocide tank—"Tank_Init"; ORP sensor 105—"ORP_Init"; TDS Sensor 25.3—"TDS_Init"; and pH sensor 110—"pH_Init". The valve 125 is opened a prescribed amount of time. While the valve 125 is opened the following sensors are read and values stored: flow meter 120, TDS Sensor 25.3 ("TDS_Upstream") and TDS sensor 25.4 ("TDS_Downstream"). If the flow meter 125 shows "Flow"=True, record "Injection Flow Success" otherwise "Injection Flow Questionable". If "TDS_Upstream"<"TDS_Downstream", record "Injection TDS Success" otherwise "Injection TDS Questionable". The system then closes the valve 125 and reads and records the load cell 210 on the oxidizing biocide tank "Tank_Final". If "Tank_Final"<"Tank_Init", record "Injection Mass Success" otherwise "Injection Mass Questionable". If at least two of three measurements are successful, then record that the injection was successful. If only one of three measurements is a success true, then let the system exchange three whole system volumes. Then measure; ORP sensor 105—"ORP_Final"; TDS Sensor 25.3—"TDS_Final"; and pH sensor 110—"pH_Final" in the injection loop and compare to initial values. If at least two of the three measurements show measurable change, assume injection was successful. If one or none of the measurements show change, assume injection was not successful and repeat routine.

Upon closure of the valve 125, wait for four injection loop fluid volume exchanges and measure the TDS sensors 25.3 and 25.4 before and after the injection valves. If the TDS value after the injection valve is measurably higher than the TDS value before the injection valve, assume the valve did not close. Cycle valve three times electronically with software. Wait for four fluid injection loop volume exchanges then repeat TDS measurements before and after the injection valve. If TDS values do not match within range, send an alarm to system operators to examine the injection valve.

Figure 4C:
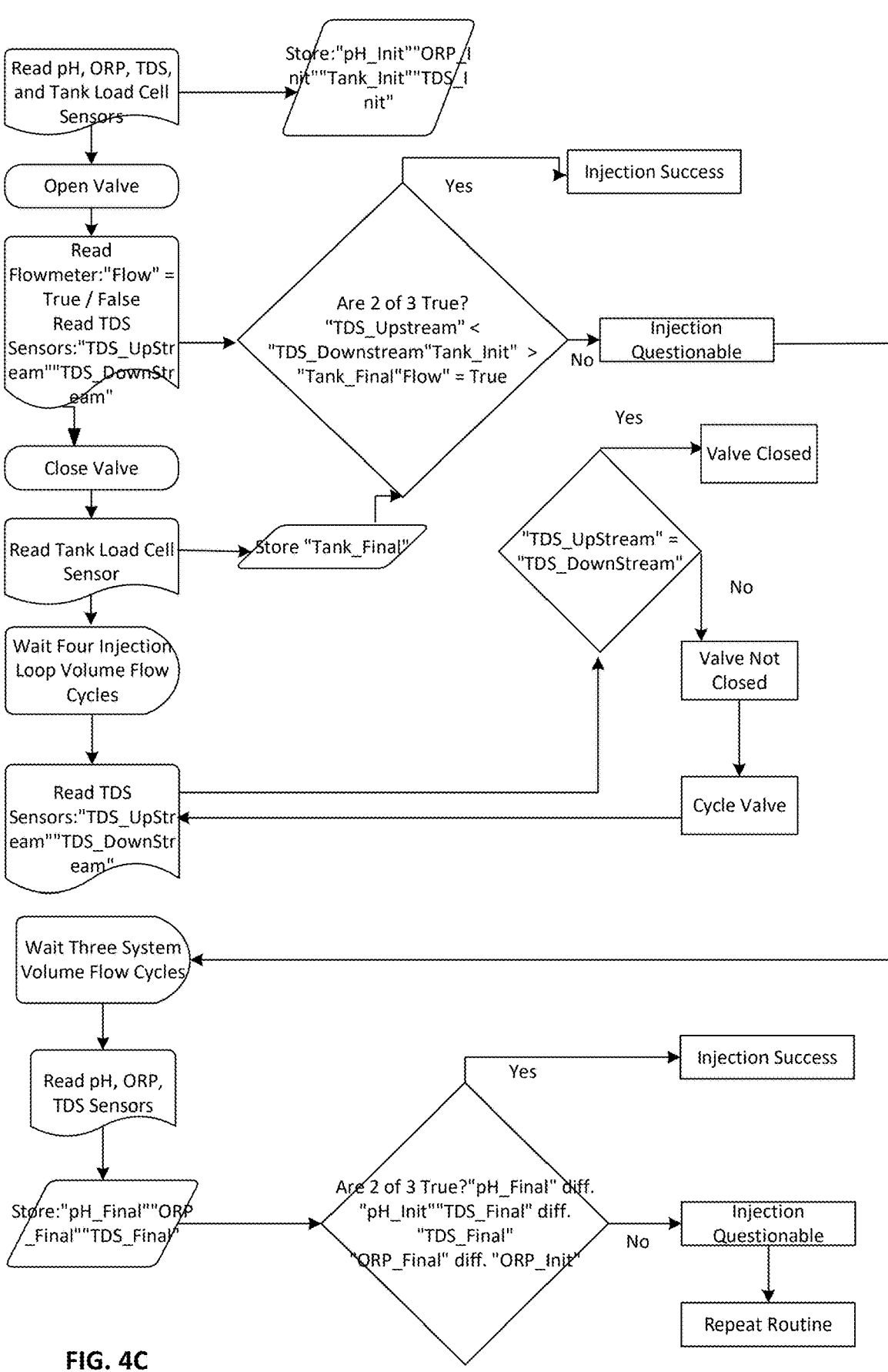
FIG. 4C is a flowchart for confirming the injection of the corrosion inhibitor during the biocide injection routine.
Figure 4D:
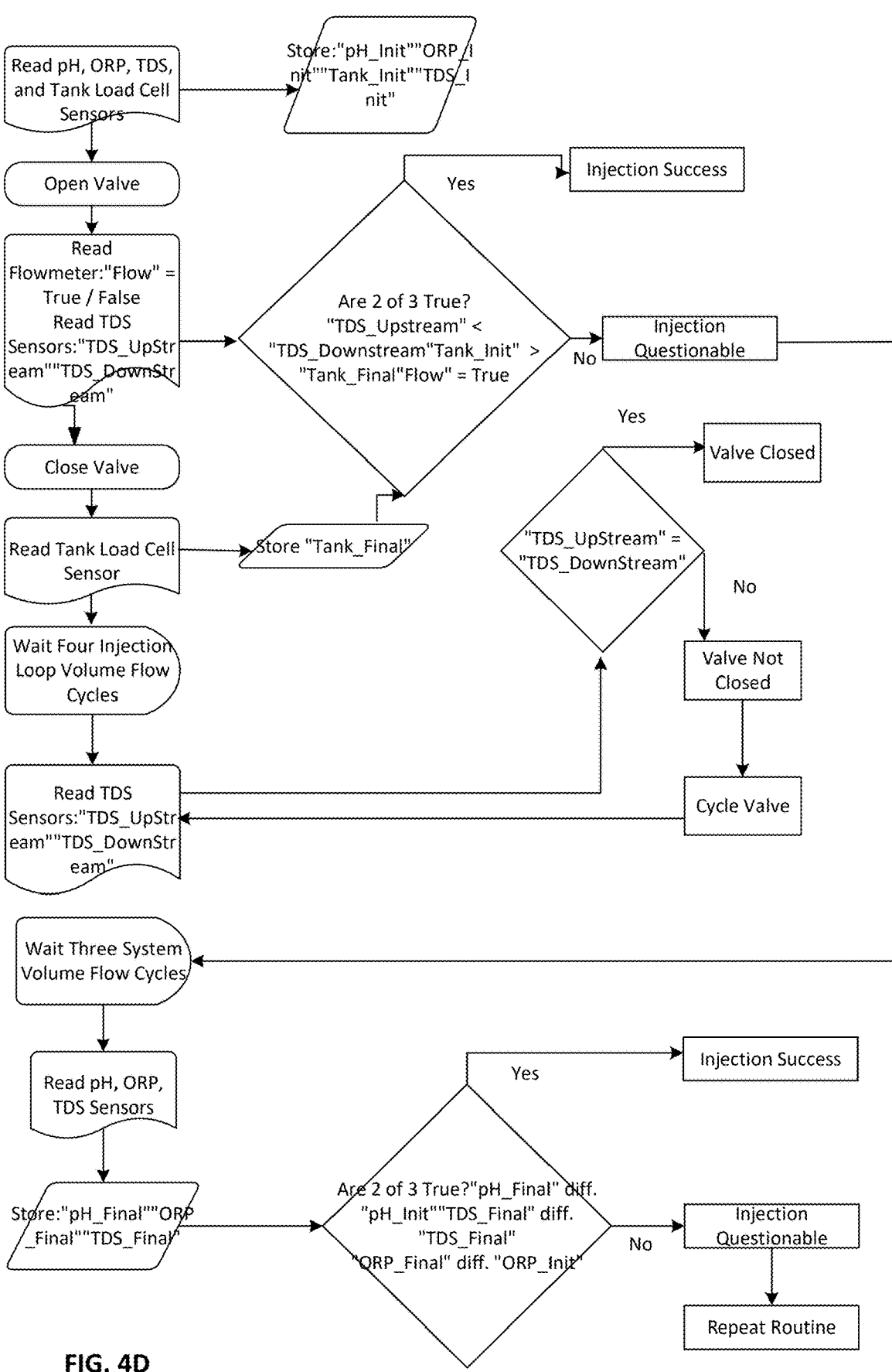
FIG. 4D is a flowchart for confirming the injection of the non-oxidizing biocide during the biocide injection routine.

The corrosion inhibitor injection confirmation routine shown in FIG. 4C is similar to that of the oxidizing biocide routine just described. The following sensors are read and values stored in software: load cell 210 on corrosion inhibitor tank—"Tank_Init"; ORP sensor 105—"ORP_Init"; TDS Sensor 25.3—"TDS_Init"; and pH sensor 110—"pH_Init". The valve 125 is opened a prescribed amount of time. While the valve 125 is opened the following sensors are read and values stored: flow meter 120, TDS Sensor 25.3 ("TDS_Upstream") and TDS sensor 25.4 ("TDS_Downstream"). If the flow meter 120 shows "Flow"=True, record "Injection Flow Success" otherwise "Injection Flow Questionable". If "TDS_Upstream"<"TDS_Downstream", record "Injection TDS Success" otherwise "Injection TDS Questionable". The system then closes the valve 125 and reads and records the load cell 210 on the corrosion inhibitor tank "Tank_Final". If "Tank_Final"<"Tank_Init", record "Injection Mass Success" otherwise "Injection Mass Questionable". If at least two of three measurements are successful, then record that the injection was successful. If only one of three measurements is a success true, then let the system exchange three whole system volumes. Then measure; ORP sensor 105—"ORP_Final"; TDS Sensor 25.3—"TDS_Final"; and pH sensor 110—"pH_Final" in the injection loop and compare to initial values. If at least two of the three measurements show measurable change, assume injection was successful. If one or none of the measurements show change, assume injection was not successful and repeat routine.

Upon closure of the valve 125, wait for four injection loop fluid volume exchanges and measure the TDS sensors 25.3 and 25.4 before and after the injection valves. If the TDS value after the injection valve is measurably higher than the TDS value before the injection valve, assume the valve did not close. Cycle valve three times electronically with software. Wait for four fluid injection loop volume exchanges then repeat TDS measurements before and after the injection valve. If TDS values do not match within range, send an alarm to system operators to examine the injection valve.

In FIG. 4D the non-oxidizing biocide injection confirmation routine is detailed which is similar to the routines just described. The following sensors are read and values stored in software: load cell 210 on corrosion inhibitor tank—"Tank_Init"; ORP sensor 105—"ORP_Init"; TDS Sensor 25.3—"TDS_Init"; and pH sensor 110—"pH_Init". The valve 125 is opened a prescribed amount of time. While the valve 125 is opened the following sensors are read and values stored: flow meter 120, TDS Sensor 25.3 ("TDS_Upstream") and TDS sensor 25.4 ("TDS_Downstream"). If the flow meter 120 shows "Flow"=True, record "Injection Flow Success" otherwise "Injection Flow Questionable". If "TDS_Upstream"<"TDS_Downstream", record "Injection TDS Success" otherwise "Injection TDS Questionable". The system then closes the valve 125 and reads and records the load cell 210 on the non-oxidizing biocide tank "Tank_Final". If "Tank_Final"<"Tank_Init", record "Injection Mass Success" otherwise "Injection Mass Questionable". If at least two of three measurements are successful, then record that the injection was successful. If only one of three measurements is a success true, then let the system exchange three whole system volumes. Then measure; ORP sensor 105—"ORP_Final"; TDS Sensor 25.3—"TDS_Final"; and pH sensor 110—"pH_Final" in the injection loop and compare to initial values. If at least two of the three measurements show measurable change, assume injection was successful. If one or none of the measurements show change, assume injection was not successful and repeat routine.

Upon closure of the valve 125, wait for four injection loop fluid volume exchanges and measure the TDS sensors 25.3 and 25.4 before and after the injection valves. If the TDS value after the injection valve is measurably higher than the TDS value before the injection valve, assume the valve did not close. Cycle valve three times electronically with software. Wait for four fluid injection loop volume exchanges then repeat TDS measurements before and after the injection valve. If TDS values do not match within range, send an alarm to system operators to examine the injection valve.

Figure 4E:
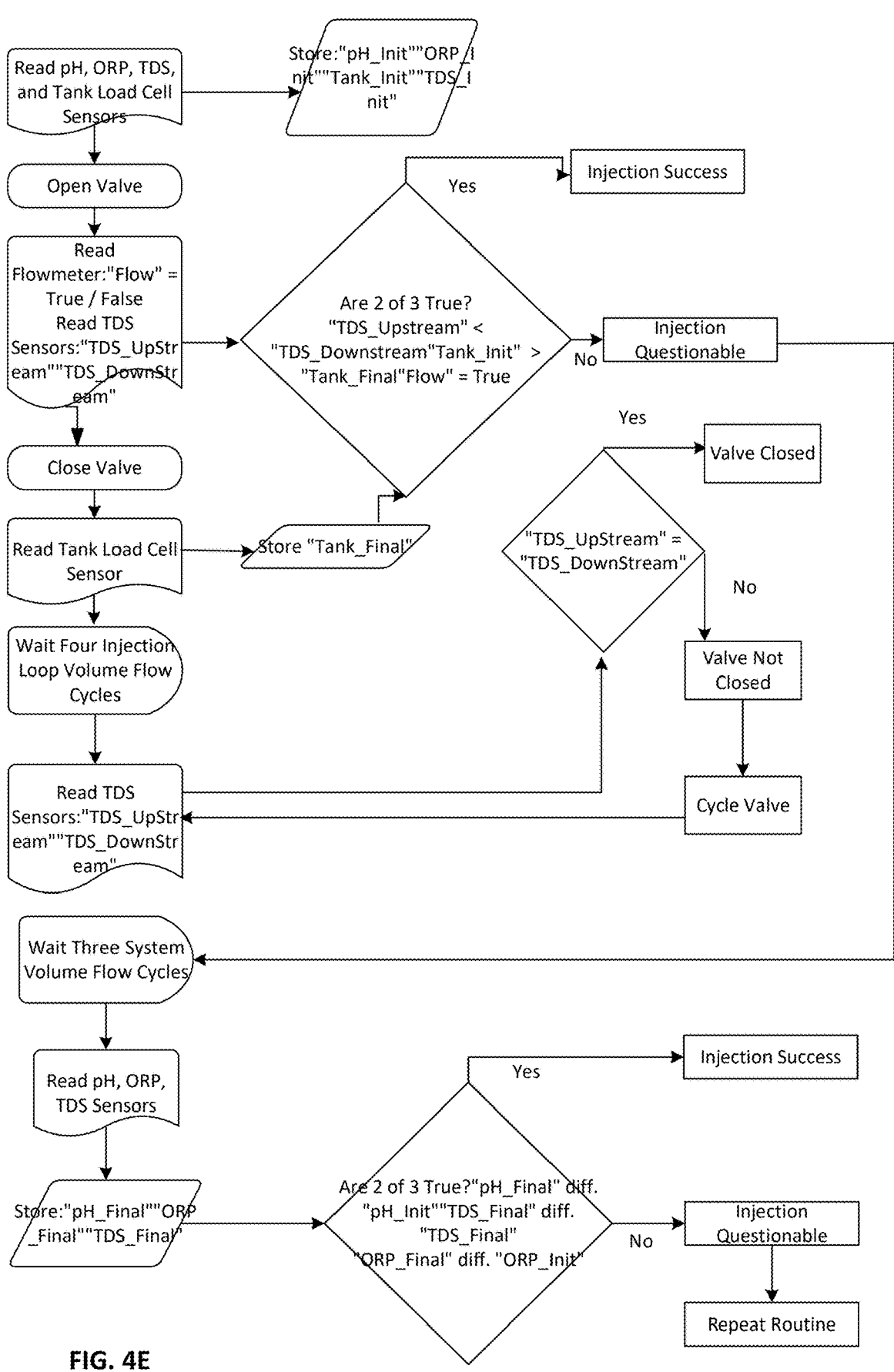
FIG. 4E is a flowchart for confirming the injection of the algaecide during the biocide injection routine.

The algaecide injection confirmation routine shown in FIG. 4E is also similar to routines just described. The following sensors are read and values stored in software: load cell 210 on algaecide tank—"Tank_Init"; ORP sensor 105—"ORP_Init"; TDS Sensor 25.3—"TDS_Init"; and pH sensor 110—"pH_Init". The valve 125 is opened a prescribed amount of time. While the valve 125 is opened the following sensors are read and values stored: flow meter 120, TDS Sensor 25.3 ("TDS_Upstream") and TDS sensor 25.4 ("TDS_Downstream"). If the flow meter 120 shows "Flow"=True, record "Injection Flow Success" otherwise "Injection Flow Questionable". If "TDS_Upstream"<"TDS_Downstream", record "Injection TDS Success" otherwise "Injection TDS Questionable". The system then closes the valve 125 and reads and records the load cell 210 on the algaecide biocide tank "Tank_Final". If "Tank_Final"<"Tank_Init", record "Injection Mass Success" otherwise "Injection Mass Questionable". If at least two of three measurements are successful, then record that the injection was successful. If only one of three measurements is a success true, then let the system exchange three whole system volumes. Then measure; ORP sensor 105—"ORP_Final"; TDS Sensor 25.3—"TDS_Final"; and pH sensor 110—"pH_Final" in the injection loop and compare to initial values. If at least two of the three measurements show measurable change, assume injection was successful. If one or none of the measurements show change, assume injection was not successful and repeat routine.

Upon closure of the valve 125, wait for four injection loop fluid volume exchanges and measure the TDS sensors 25.3 and 25.4 before and after the injection valves. If the TDS value after the injection valve is measurably higher than the TDS value before the injection valve, assume the valve did not close. Cycle valve three times electronically with software. Wait for four fluid injection loop volume exchanges then repeat TDS measurements before and after the injection valve. If TDS values do not match within range, send an alarm to system operators to examine the injection valve.

While the systems and subsystems described above are detailed in connection with a negative pressure system, they are also applicable to a positive pressure CDU.

While this document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

The invention claimed is:

1. An automatic coolant quality subsystem (ACQ) (100) for use in a coolant distribution unit (CDU) (10), the ACQ (100) comprising:

a coolant conduit (155) comprising a coolant;

an oxidation-reduction potential (ORP) sensor (105) fluidly connected to the coolant conduit (155);

an additive injection subcomponent (103) fluidly connected to the coolant conduit (155), the injection subcomponent comprising a plurality of injection branches, each branch comprising an additive container (200) fluidly connected to a valve (125), an additive flow meter (120) and the coolant conduit (155), wherein at least one additive container (200) comprises an oxidizing biocide; and at least one additive container (200) comprises a corrosion inhibitor; and a processor (65) connected to the ORP sensor (105) and the additive injection subcomponent (103), the processor (65) programmed to execute a time-indexed challenge-response sequence comprising:

i. acquiring a baseline ORP value at time $t_0$;

ii. actuating the valve (125) to inject a predetermined dose of the oxidizing biocide;

acquiring ORP values at times $t_1$ and $t_2$, and comparing an observed ORP response profile ($\Delta$ORP over $t_0 \rightarrow t_2$)

iii. to an expected response for the CDU's known coolant volume; and only when the observed ORP response iv. is equal to or slower than the expected response, actuating the valve (125) to inject a predetermined dose of corrosion inhibitor, otherwise repeating step (i)-(iii).

2. The ACQ (100) of claim 1, wherein the processor (65) computes each predetermined dose using the CDU's total coolant quantity, stored flow-metered additive mass, and prior ORP responses, to maintain closed-loop stability absent evaporative blowdown.

3. The ACQ (100) of claim 1, further comprising additive-injection verification logic using paired conductivity/TDS measurements immediately upstream and downstream of an injection valve, the processor being configured to (a) command valve closure, (b) wait for at least four injection-loop volume exchanges, (c) compare the upstream and downstream TDS values, and (d) declare a valve-fault alarm and re-cycle the valve if the TDS values differ beyond a tolerance, thereby detecting a leaking or stuck valve in situ.

4. The ACQ (100) of claim 1, wherein:

at least one additive container (200) comprises a non-oxidizing biocide.

5. The ACQ (100) of claim 4, wherein the non-oxidizing biocide comprises isothiazolinones, methyl isothiazolinones, chloromethylisotiazolinones, quaternary ammonium compounds, or EDTA.

6. The ACQ (100) of claim 1, wherein:

at least one additive container (200) comprises an algaecide; and the processor (65) is programmed to perform the following additional steps:

after completion of the corrosion inhibitor injection, actuate the valve (125) to release a predetermined amount of algaecide into the coolant.

7. The ACQ (100) of claim 6, wherein the algaecide comprises copper ethanolamine complexes, copper sulfate, or quaternary ammonium compounds.

8. The ACQ (100) of claim 1, wherein:

at least one additive container (200) comprises a descaler; and the processor (65) is programmed to perform the following additional steps:

after completion of the corrosion inhibitor injection, actuate the valve (125) to release a predetermined amount of descaler into the coolant.

9. An automatic coolant quality subsystem (ACQ) (100) for use in a coolant distribution unit (CDU) (10), the ACQ (100) comprising:

a coolant conduit (155) comprising a coolant;

a first total dissolved solids (TDS) sensor (35.3) fluidly connected to the coolant conduit (155);

an additive injection subcomponent (103) fluidly connected to the coolant conduit (155) downstream of the upstream sensor bank (101), the injection subcomponent comprising a plurality of injection branches, each branch comprising an additive container (200) fluidly connected to a valve (125), an additive flow meter (120) and the coolant conduit (155), wherein each additive container (200) comprises an additive mass sensor (210, 210.1);

a second TDS sensor (35.4) fluidly connected to the coolant conduit (155) downstream of the additive injection subcomponent (103);

a processor (65) connected to first TDS sensor (35.3), the second TDS sensor (35.4), the additive flow meter (120), the valve (125) and the additive mass sensor (210, 210.1), the processor (65) programmed to perform the following steps:

a. measure and record the values from the first TDS sensor (35.3) and the additive mass sensor (210, 210.1);

b. actuate the valve (125) to release a predetermined amount of additive into the coolant;

c. record whether the additive flow meter (120) registers a flow of additive;

d. measure and record the value from the second TDS sensor (35.4);

e. actuate the valve (125) to close;

f. measure and record the value from the additive mass sensor (210, 210.1) after step (e);

g. confirm a successful additive injection if at least two of the following conditions are true:

1. the TDS sensor value from step (a) is greater than the TDS sensor value from step (d);

2. the additive mass sensor value from step (a) is greater than the additive mass sensor value from step (f);

3. the additive flow meter (120) registered a flow of additive in step (c).

10. The ACQ (100) of claim 9, further comprising:

a pH sensor (110) and an oxidative reduction potential (ORP) sensor (105) fluidly connected to the coolant conduit (155);

wherein the processor (65) is connected to the pH sensor (110) and oxidative reduction potential (ORP) sensor (105), the processor (65) is programmed to perform the following additional steps:

h. prior to step (b), measure and record the values from the ph sensor (110) and the ORP sensor (105);

i. if additive injection is unsuccessful at step (g), then record and measure values from pH sensor (110), the ORP sensor (105) and at least one of the TDS sensor (35.3, 35.4);

j. confirm a successful additive injection if at least two of the following conditions are true:

1. the TDS sensor value from step (a) is measurably different than the TDS sensor value from step (i);

2. the pH sensor value from step (h) is measurably different than the pH sensor value in step (i);

3. the ORP sensor value from step (h) is measurably different than the ORP sensor value in step (i);

k. if additive injection is unsuccessful at step (j), then return to step (a).

11. The ACQ (100) of claim 9, wherein the processor (65) is programmed to perform the following additional steps:

h. after step (e), measure and record the values from the first TDS sensor (35.3) and the second TDS sensor (35.4);

i. confirm successful closure of valve (125) if the TDS values from step (h) are equal;

l. if the TDS values from step (h) are not equal, then actuate the valve (125) to close multiple times and return to step (h).

12. The ACQ (100) of claim 9, wherein the additive containers (200) in the plurality comprise at least two of the following: an oxidizing biocide, a non-oxidizing biocide, a corrosion inhibitor, an algaecide or a descaler.

13. The ACQ (100) of claim 12, wherein:

the oxidizing biocide comprises sodium hypochlorite or monochloramines;

the corrosion inhibitor comprises azoles, chlorinated azoles, or molybdate ion;

the non-oxidizing biocide comprises isothiazolinones, methyl isothiazolinones, chloromethyisotiazolinones, quaternary ammonium compounds, or EDTA;

the algaecide comprises copper ethanolamine complexes, copper sulfate, or quaternary ammonium compounds.

14. The ACQ (100) of claim 9, wherein the processor (65) computes the predetermined amount of additive based on a total quantity of coolant in the CDU.

\* \* \* \* \*